United States Patent [19]

Pecora et al.

[11] Patent Number: 5,379,346

[45] Date of Patent: Jan. 3, 1995

[54] CASCADING SYNCHRONIZED CHAOTIC SYSTEMS

[75] Inventors: Louis M. Pecora; Thomas L. Carroll, both of Alexandria, Va.

[73] Assignee: The United States of America as represented by the Secretary of the Navy, Washington, D.C.

[21] Appl. No.: 129,495

[22] Filed: Sep. 30, 1993

[51] Int. Cl.6 .......................... H03B 29/00; G06F 1/02
[52] U.S. Cl. .......................................... 380/48; 380/9; 380/46; 331/78; 364/717
[58] Field of Search ............... 331/78; 364/717; 380/9, 380/46, 48, 49, 50

[56] References Cited

U.S. PATENT DOCUMENTS

| | | | |
|---|---|---|---|
| 5,007,087 | 4/1991 | Bernstein et al. | 380/46 |
| 5,245,660 | 9/1993 | Pecora et al. | 380/48 |
| 5,291,555 | 3/1994 | Cuomo et al. | 380/48 X |

OTHER PUBLICATIONS

K. Murali and M. Lakshmanan, "Transmission of Signals by Synchronization in a chaotic Van der Pol-Duffing Oscillator", *Physical Review E*, vol. 48, No. 3, Sep., 1993, pp. R1624-R1626.
James P. Crutchfield et al., "Chaos", Dec. 1986, pp. 46-57, *Scientific American*.
Louis M. Pecora and Thomas L. Carroll, "Synchronization in Chaotic Systems", *Physical Review Letters*, vol. 64, No. 8, Feb. 19, 1990, pp. 821-824.
Louis M. Pecora and Thomas L. Carroll, "Driving systems with chaotic signals", *Physical Review A*, vol. 44, No. 4, Aug. 15, 1991, pp. 2374-2383.
Thomas L. Carroll and Louis N. Pecora, "Synchronizing Chaotic Circuits", *IEEE Transactions on Circuits and Systems*, vol. 38, No. 4, Apr. 1991, pp. 453-456.
Lou Pecora and Tom Carroll, "Synchronized Chaotic Signals and Systems", *Proceedings of ICASSP Conference*, San Francisco, Calif., Mar. 1992.
Alan V. Oppenheim et al., "Signal Processing in the Context of Chaotic Signals", *IEEE International Conference*, San Francisco, Calif., Mar. 1992.
T. L. Carroll and L. M. Pecora, "A Circuit For Studying The Synchronization of Chaotic Systems", *International Journal of Bifurcation and Chaos*, vol. 2, No. 3, Published Dec. 4, 1992, pp. 659-667.

(List continued on next page.)

*Primary Examiner*—Bernarr E. Gregory
*Attorney, Agent, or Firm*—Daniel Kalish; Thomas E. McDonnell

[57] ABSTRACT

A cascaded synchronized nonlinear system includes a nonlinear transmitter having stable first and second subparts. The first subpart produces a first transmitter signal for driving the second subpart and the second subpart produces a second transmitter signal for driving the first subpart. The nonlinear transmitter transmits the second transmitter signal to a nonlinear cascaded receiver. The receiver, being for producing an output signal in synchronization with the second transmitter signal, includes a first stage (a duplicate of the first subpart) responsive to the second transmitter signal for producing a first receiver signal. The receiver further includes a second stage (a duplicate of the second subpart) responsive to the first receiver signal for producing the output signal. The cascaded synchronized nonlinear system can be used in an information transfer system. The transmitter, responsive to an information signal produces a drive signal for transmission to the receiver. An error detector compares the drive signal and the output signal produced by the receiver to produce an error signal indicative of the information contained in the information signal.

36 Claims, 26 Drawing Sheets

OTHER PUBLICATIONS

L. J. Kocarev et al., "Experimental Demonstration of Secure Communications Via Chaotic Synchronization", *International Journal of Bifurcation and Chaos,* vol. 2, No. 3, Published Dec. 4, 1992, pp. 709–713.

U. Parlitz et al., "Transmission of Digital Signals By Chaotic Synchronization", *International Journal of Bifurcation and Chaos,* vol. 2, No. 4, (1992) 973–977.

Kevin M. Cuomo and Alan V. Oppenheim, "Circuit Implementation of Synchronized Chaos With Applications to Communications", *Physical Review Letters,* vol. 71, No. 1, Jul. 5, 1993, pp. 65–68.

William L. Ditto and Louis M. Pecora, "Mastering Chaos", *Scientific American,* Aug. 1993, vol. 269, No. 2, pp. 78–84.

Joseph Neff and Thomas L. Carroll, "Circuits That Get Chaos in Sync", *Scientific American,* Aug. 1993, pp. 120–122.

Thomas L. Carroll and Louis M. Pecora, "Communicating with Chaos", 1993 NRL Review, pp. 75–82.

T. L. Carroll and L. M. Pecora, "Cascading Synchronized Chaotic Systems", Physica D, vol. 67, 1993, pp. 126–140.

U.S. application Ser. No. 07/880,789, filed May 11, 1992 Pecora et al., assigned by the United States Government.

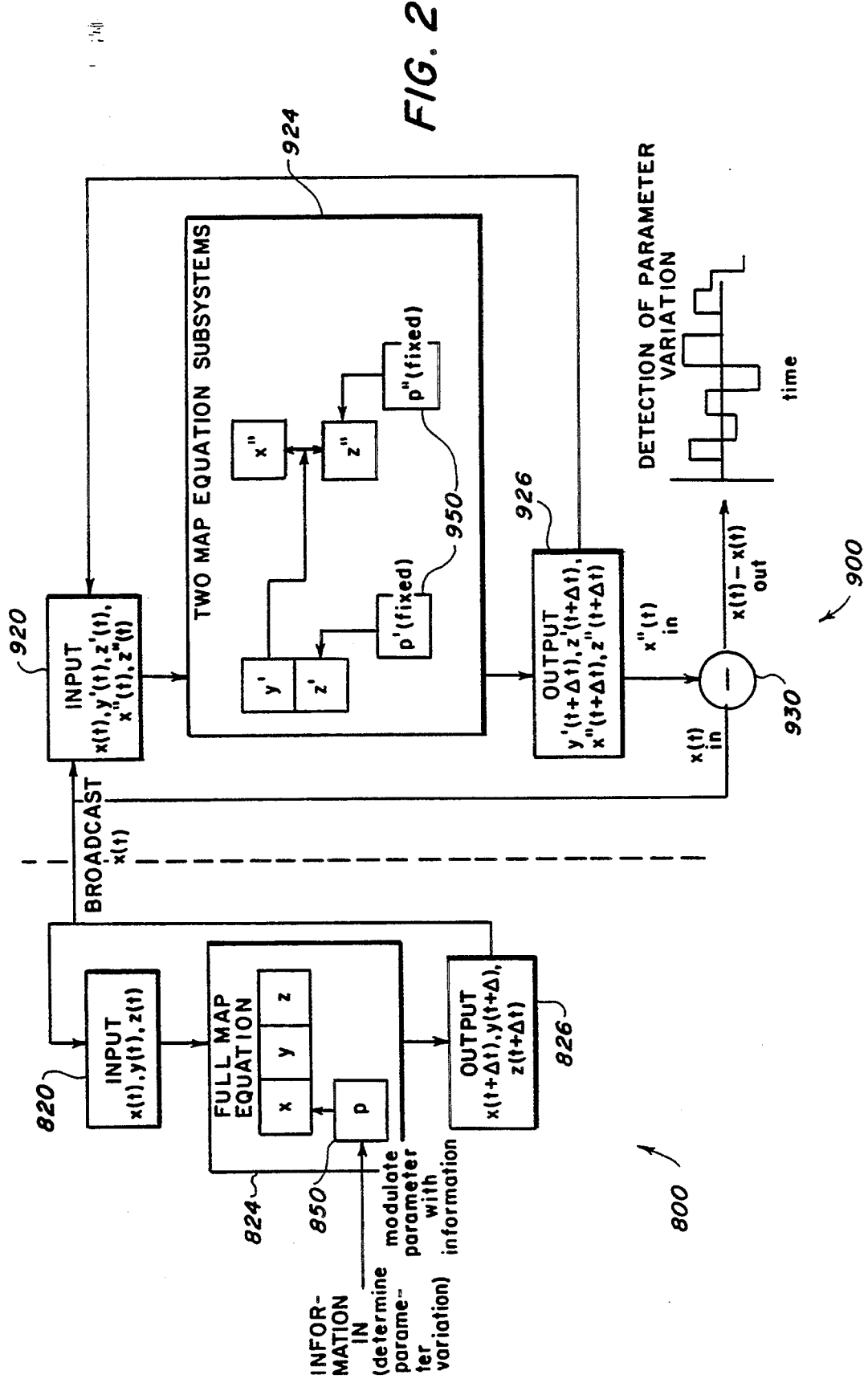

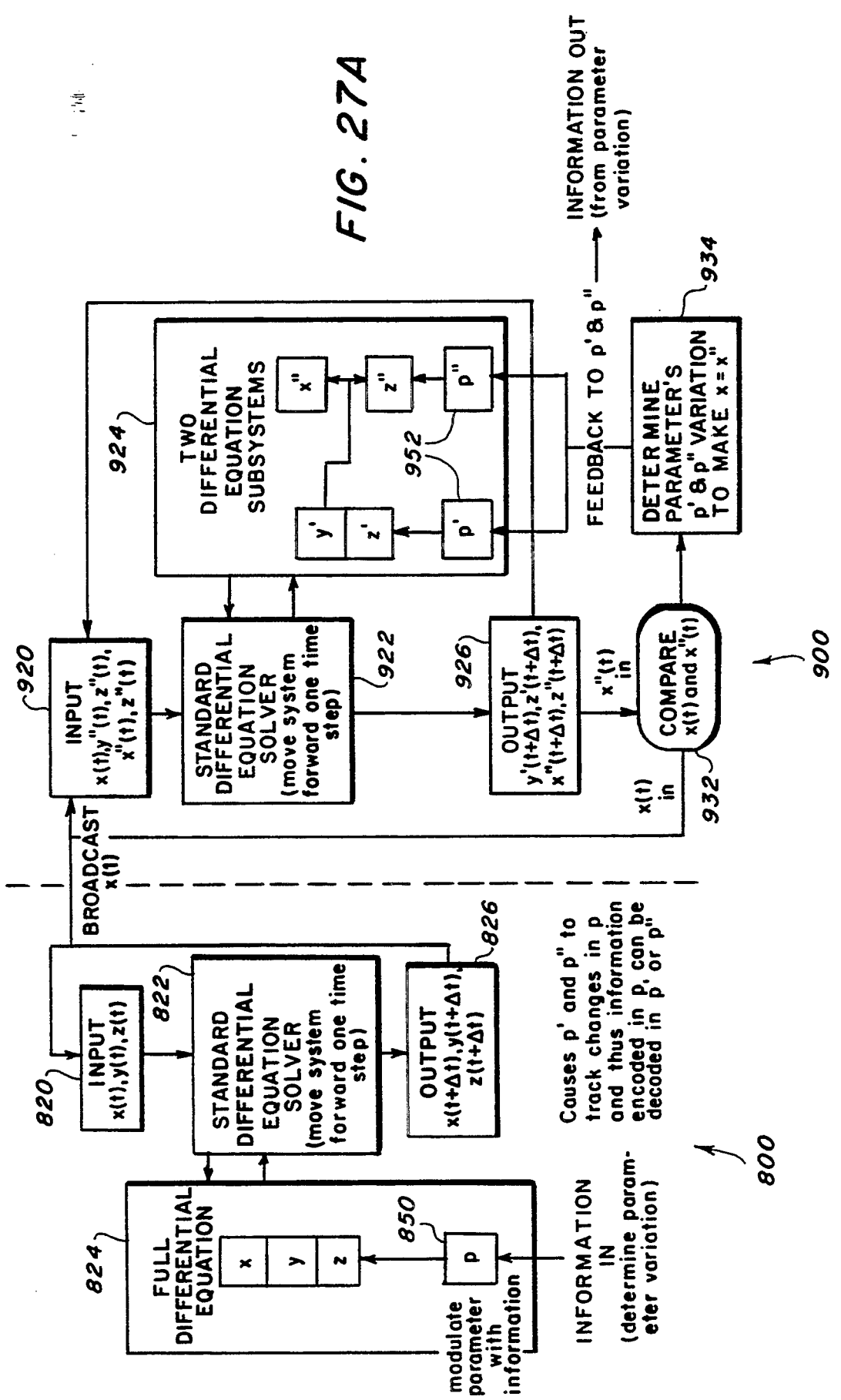

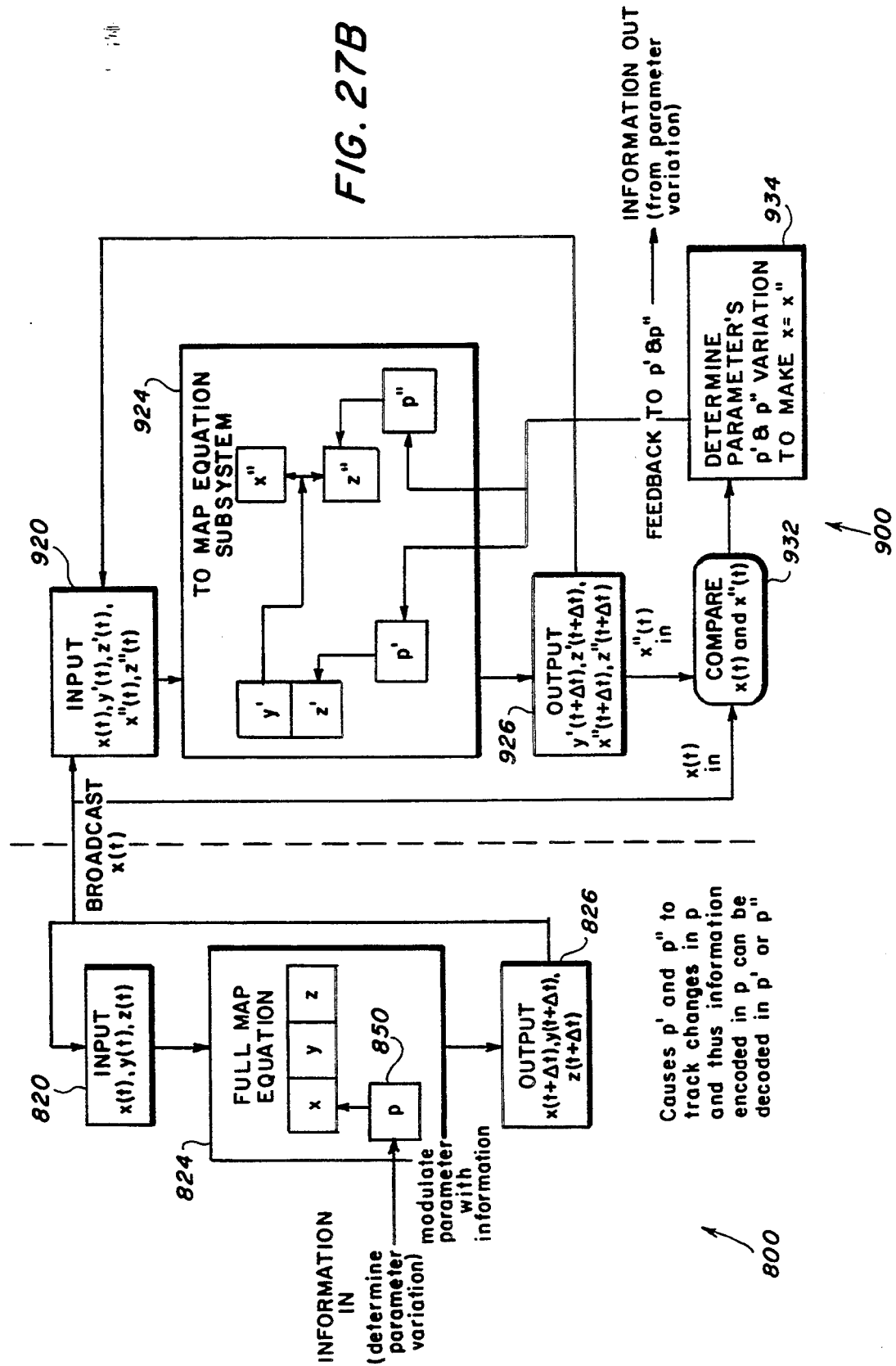

CASCADING SYNCHRONIZED CHAOTIC SYSTEMS

CROSS REFERENCE TO RELATED PATENTS AND APPLICATIONS

This application is related to commonly assigned U.S. patent application Ser. No. 07/656,330 filed Feb. 19, 1991 (now U.S. Pat. No. 5,245,660) by the same inventors and having Navy Case no. 72,593. This application is also related to commonly assigned U.S. application Ser. No. 07/880,789 filed May 11, 1992 by the same inventors and having Navy case no. 73,912. Both U.S. Pat. No. 5,245,660 and U.S. application Ser. No. 07/880,789 are incorporated herein by reference.

1. Field Of The Invention

The present invention relates generally to physical systems with dynamical characteristics and, in particular, to systems for producing synchronized signals which are capable of information transfer.

2. Background of the Invention

The design of most man-made mechanical and electrical systems assumes that the systems exhibit linear behavior (stationary) or simple nonlinear behavior (cyclic). In recent years there has been an increasing understanding of a more complex form of behavior, known as chaos, which is now recognized to be generic to most nonlinear systems. Systems evolving chaotically (chaotic systems) display a sensitivity to initial conditions, such that two substantially identical chaotic systems started with slightly different initial conditions (state variable values) will quickly evolve to values which are vastly different and become totally uncorrelated, even though the overall patterns of behavior will remain the same. This makes chaotic systems nonperiodic (there are no cycles of repetition whatsoever), unpredictable over long times, and thus such systems are impossible to synchronize by conventional methods. Y. S. Tang et al., "Synchronization and Chaos," *IEEE Transactions of Circuits and Systems*, Vol. CAS-30, No. 9, pp. 620–626 (September 1983) discusses the relationship between synchronization and chaotic systems in which selected parameters are outside some range required for synchronization.

SUMMARY OF THE INVENTION

It is an object of the present invention to provide systems for producing synchronized signals, and particularly nonlinear dynamical systems.

It is another object of the present invention to provide communication systems for encryption utilizing synchronized nonlinear sending and receiving circuits.

It is a further object of the present invention to provide improved control devices which rely on wide-frequency band synchronized signals.

It is an object of the present invention to provide synchronizable systems in which only a single drive signal is transmitted between systems, multiple synchronized signals can be produced and in which the drive signal can be reproduced to confirm synchronization.

It is an object of the present invention to provide synchronizable systems in which the total dimension of the synchronized systems or the number of elements can be the same.

It is also an object of the present invention to provide synchronizable chaotic systems using cascaded subsystems.

It is a further object of the present invention to transmit information using cascaded synchronizable chaotic systems.

It is still another object of the present invention to transmit information using cascaded synchronizable chaotic systems using parameter changes to transmit information.

The above objects can be accomplished by two types of systems: single stage systems and cascaded systems. The difference in single stage and cascaded systems lies primarily on the receiver side. In single stage systems only a single subsystem of the transmitter is reproduced. In cascaded systems the receiver is cascaded in that the receiver includes two or more cascade connected subsystems of the transmitter. In both types of systems the synchronizable chaotic transmitter and receiver systems can be at a great distance from each other.

In single stage systems transmitter and receiver are synchronized by transmitting a drive signal produced by the chaotic system in the transmitter, to a receiver which is a duplicate of part of the transmitter.

To transmit information the transmitter transmits information by adding an information signal to a primary signal and transmitting the modified primary signal along with the drive signal to the receiver. The receiver determines the information signal by using the drive signal.

The above-described system can be improved to remove the need for transmitting different drive and synchronized signals by cascade connecting subsystems of the chaotic system in the receiver.

A cascaded synchronized nonlinear system includes a nonlinear transmitter having stable first and second subparts. The first subpart produces a first transmitter signal for driving the second subpart and the second subpart produces a second transmitter signal for driving the first subpart. The nonlinear transmitter transmits the second transmitter signal to a nonlinear cascaded receiver. The receiver, being for producing an output signal in synchronization with the second transmitter signal, comprises a first stage (a duplicate of the first subpart) responsive to the second transmitter signal for producing a first receiver signal. The receiver further comprises a second stage (a duplicate of the second subpart) responsive to the first receiver signal for producing the output signal.

The cascaded synchronized nonlinear system can be used in an information transfer system. The transmitter, responsive to an information signal produces a drive signal for transmission to the receiver. An error detector compares the drive signal and the output signal produced by the receiver to produce an error signal indicative of the information contained in the information signal.

These and other objects, features and advantages of the present invention are described in or apparent from the following detailed description of preferred embodiments.

BRIEF DESCRIPTION OF THE DRAWINGS

The preferred embodiments will be described with reference to the drawings, in which like elements have been denoted throughout by like reference numerals, and wherein:

FIGS. 27A and B depict the FIG. 22 embodiment implemented in software.

DETAILED DESCRIPTION OF THE PREFERRED EMBODIMENTS

All physical systems can be described by state variables. For example, a billiard game can be described by the position and the velocity of a ball at any instant of time; and an electronic circuit can be described by all of its currents and voltages at a particular time. This invention is a tangible system which can be of any form. The state variables and associated signals can be, as further examples, pressure or other force, temperature, concentration, population, or electro-magnetic field components. The evolution of a physical system depends on the dynamical relations between the state variables, which are usually expressed as functional relations between the rates of change of the variables. Thus, most but not all physical systems are describable in terms of ordinary differential equations (ODEs). Mathematical models of chaotic systems often involve two types of systems: flows and iterative maps. The former evolve as solutions of differential equations, and the latter evolve in discrete steps, such as by difference equations. For example, seasonal measurements of populations can be modeled as iterative maps. Cf., Eckmann et al., *Rev. Mod. Phys.*, Vol. 57, pp. 617–618, 619 (1985). Some iterative maps could be considered as numerical solutions to differential equations. Solution or approximate solution of these equations, such as approximate, numerical, or analytical solution, provides information about the qualitative and quantitative behavior of the system defined by the equations.

As used herein, the synchronization of two or more evolving state variables of a physical system means the process by which the variables converge toward the same or linearly related but changing set of values. Thus, if one synchronized variable changes by a certain amount, the change of the other synchronized variable will also approach a linear function of the same amount. Graphically, the plot of the synchronized variables against each other as they evolve over time would approach a straight line.

Figure 1:
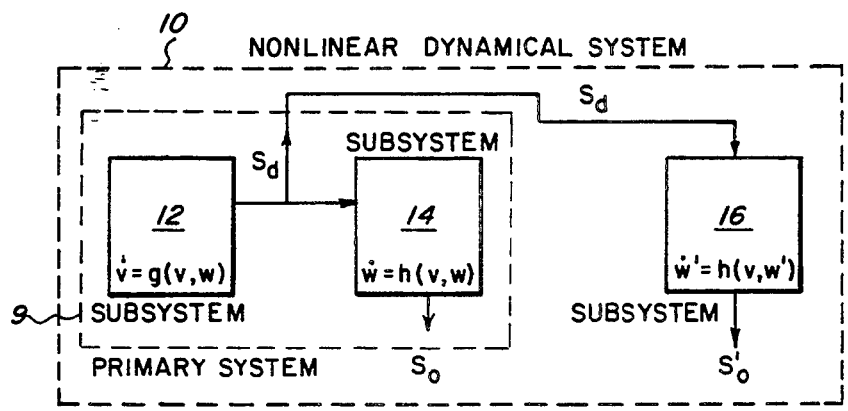
FIG. 1 is a general block diagram of a nonlinear dynamical physical system according to the present invention.

Referring to FIG. 1, an n-dimensional autonomous nonlinear dynamical primary system 9 can be arbitrarily divided, as shown, into first and second parts or subsystems 12 and 14, each of which subsystems is also a non-linear dynamical system. Primary system 9 and more specifically, subsystem 14, has output signal $S_o$.

The following discussion involves mathematical modeling of the system 10 in terms of solutions to differential equations and provides theoretical support for the invention. However, it is not necessary in practicing this invention that system 10 be susceptible to such modeling. For example, as stated earlier, some iterated maps cannot be modeled as solutions to differential equations, and yet this invention encompasses systems evolving according to iterated maps. As a further example, it is impractical to accurately model an ideal gas by individually considering the position and momentum of every molecule because of the vast number of molecules and variables involved.

This discussion about mathematical modeling is in two parts to correspond to two sources of difficulty in synchronizing signals: instability within a single system (chaos) and instability between two systems (structural instability). It is understood that both discussions apply to this invention and neither part should be read separately as limiting the practice of this invention.

A system with extreme sensitivity to initial conditions is considered chaotic. The same chaotic system started at infinitesimally different initial conditions may reach significantly different states after a period of time. As known to persons skilled in the art and discussed further, for example, in Wolf et al., *Determining Lyapunov Exponents from a Time Series*, Physica, Vol. 16D, p. 285 et seq. (1985), Lyapunov exponents (also known in the art as "characteristic exponents") measure this divergence. A system will have a complete set (or spectrum) of Lyapunov exponents, each of which is the average exponential rate of convergence (if negative) or divergence (if positive) of nearby orbits in phase space as expressed in terms of appropriate variables and components. If all the Lyapunov exponents are negative, then the same system started with slightly different initial conditions will converge (exponentially) over time to the same values, which values may vary over time. On the other hand, if at least one of the Lyapunov exponents is positive, then the same system started with slightly different initial conditions will not converge, and the system behaves chaotically. It is also known by persons skilled in the art that "in almost all real systems there exist ranges of parameters or initial conditions for which the system turns out to be a system with chaos .

..." Chernikov et al., *Chaos: How Regular Can It Be?*, 27 Phys. Today 27, 29 (November 1988).

Primary system 9 can be described by the ODE $$du(t)/dt = f\{u(t)\} \text{ or } \dot{u} = f(u) \quad (1)$$

where u(t) are the n-dimensional state variables.

Defined in terms of the state variables v and w for subsystems 12 and 14, respectively, where u=(v,w), the ODEs for subsystems 12 and 14 are, respectively:

$$\dot{v} = g(v,w)$$

$$\dot{w} = h(v,w) \quad (2)$$

where v and w are m and n-m dimensional, respectively, that is, where $v=(u_1, \ldots, u_m)$, $g=(f_1(u) \ldots, f_m(u))$, $w=(u_{m+1}, \ldots, u_n)$ and $h=(f_{m+1}(u), \ldots, f_n(u))$.

The division of primary system 9 into subsystems 12 and 14 is truly arbitrary since the reordering of the $u_i$ variables before assigning them to v, w, g and h is allowed.

If a new subsystem 16 identical to subsystem 14 is added to primary system 9, thereby forming system 10, then substituting the variables v for the corresponding variables in the function h augments equations (2) for the new three-subsystem system 10 as follows:

$$\dot{v} = g(v,w)$$

$$\dot{w} = h(v,w)$$

$$\dot{w}' = h(v,w'). \quad (3)$$

Subsystem 16 has output signal $S_o'$.

The w and w' subsystems (subsystems 14 and 16) will only synchronize if $\Delta w \rightarrow 0$ as $T \rightarrow \infty$, where $\Delta w = w' - w$.

The rate of change of $\Delta w$ (for small $\Delta w$) is:

$$\Delta\dot{w} = d\Delta w/dt = h(v,w') - h(v,w) = D_w h(v,w)\Delta w + W; \quad (4)$$

where $D_w h(v,w)$ is the Jacobian of the w subsystem vector field with respect to w only, that is: an $(n-m) \times (n-m)$ linear operator (matrix)

$$(D_w h)_{ij} = \partial h_i / \partial w_j \quad (5)$$

for $(m+1) \leq i \leq n$ and $1 \leq j \leq (n-m)$, and where W is a nonlinear operator. When Equation 4 is divided by $|\Delta w(0)|$, and $\xi = \Delta w(t)/\Delta w(0)$, an equation for the rate of change (the growth or shrinkage) of the unit displacement (n-m) dimensional vector, $\xi$, is obtained. In the infinitesimal limit, the nonlinear operator vanishes and this leads to the variational equation for the subsystem $$d\xi/dt = D_w h(v(t), w(t))\xi. \quad (6)$$

The behavior of this equation or its matrix version, using the usual fundamental matrix approach, depends on the Lyapunov exponents of the w subsystem. These are hereinafter referred to as sub-Lyapunov exponents to distinguish them from the full Lyapunov spectrum of the (v,w)=(u) system. Since the w subsystem 14 is driven by the v subsystem 12, the sub-Lyapunov exponents of the w subsystem 14 are dependent on the m dimensional v variable. If at least one of the sub-Lyapunov exponents is positive, the unit displacement vector $\xi$ will grow without bounds and synchronization will not take place. Accordingly, the sub-systems 14 and 16 (w and w') will synchronize only if the sub-Lyapunov exponents are all negative. This principle provides a criterion in terms of computable quantities (the sub-Lyapunov exponents) that is used to design synchronizing systems in accordance with the present invention.

The $v=(v_1, \ldots, v_m)$ components (subsystem 12) can be viewed more broadly as driving variables and the $w'=(w'_{m+1}, \ldots, w'_n)$ components (subsystem 16) as responding variables. The drive system 9 (v,w) can be viewed as generating at least one drive signal $S_d$, in the formula v(t), which is applied to the response systems w and w' (subsystems 14 and 16, respectively) to synchronize the drive system and the response system outputs. This is the approach taken in accordance with the present invention to provide synchronized nonlinear dynamical systems.

In practicing this invention, the above discussion applies to identical subsystems 14 and 16. This might be achievable, for example, in digital systems. In such systems 10, the signals $S_o$ and $S_o'$ may each be chaotic because the system 9 might be chaotic. They may differ because of different initial conditions in subsystems 14 and 16. However, they will approach each other ($\Delta w \rightarrow 0$) because systems 14 and 16 have all negative sub-Lyapunov exponents when considered as driven by the same at least one drive signal $S_d$. As used herein, a system, e.g. system 14 or 16, is "stable" with respect to a drive signal if the system has all negative sub-Lyapunov exponents with respect to that drive signal.

In most physical systems, subsystems 14 and 16 are not identical. For example, two electrical components with the same specifications typically do not have identical characteristics. The following explanation based on mathematical modeling shows that the signals $S_o$ and $S_o'$ will nevertheless be synchronized if both subsystems 14 and 16 have negative sub-Lyapunov exponents. According to this mathematical model, the synchronization is affected by differences in parameters between the w and w' systems which are found in real-life applications. Let $\mu$ be a vector of the parameters of the w subsystem (subsystem 14) and $\mu'$ of the w' subsystem (subsystem 16), so that $h = h(v,w,\mu)$, for example. If the w subsystem were one-dimensional, then for small $\Delta w$ and small $\Delta \mu = \mu' - \mu$:

$$\Delta\dot{w} \approx h_W \Delta w + h_\mu \Delta \mu \quad (7)$$

where $h_W$ and $h_\mu$ are the partial derivatives of h with respect to w and $\mu$, respectively. Roughly, if $h_W$ and $h_\mu$ are nearly constant in time, the solution of this equation will follow the formula $$\Delta w(t) = \left[ \Delta w(0) + \frac{h_\mu \cdot \Delta \mu}{h_w} \right] e^{h_w t} - \frac{h_\mu \cdot \Delta \mu}{h_w} \quad (8)$$

If $h_W < 0$, the difference between w and w' will level off at some constant value and the systems will be synchronized. Although this is a simple one dimensional approximation, it turns out to be the case for all systems that have been investigated numerically, even when the differences in parameters are rather large (~10-20%). This is also the case in the exemplary electronic synchronizing circuit described in more detail hereinbelow. Furthermore, it can be established on a mathematical basis that the small changes in parameters only lead to proportionally small degradations of synchronization, which approach a constant value. See Pecora et al., "Driving systems with chaotic signals", Physical Review A, Vol. 44, No. 4, Aug. 15, 1991, pages 2374–2383.

Figure 6:
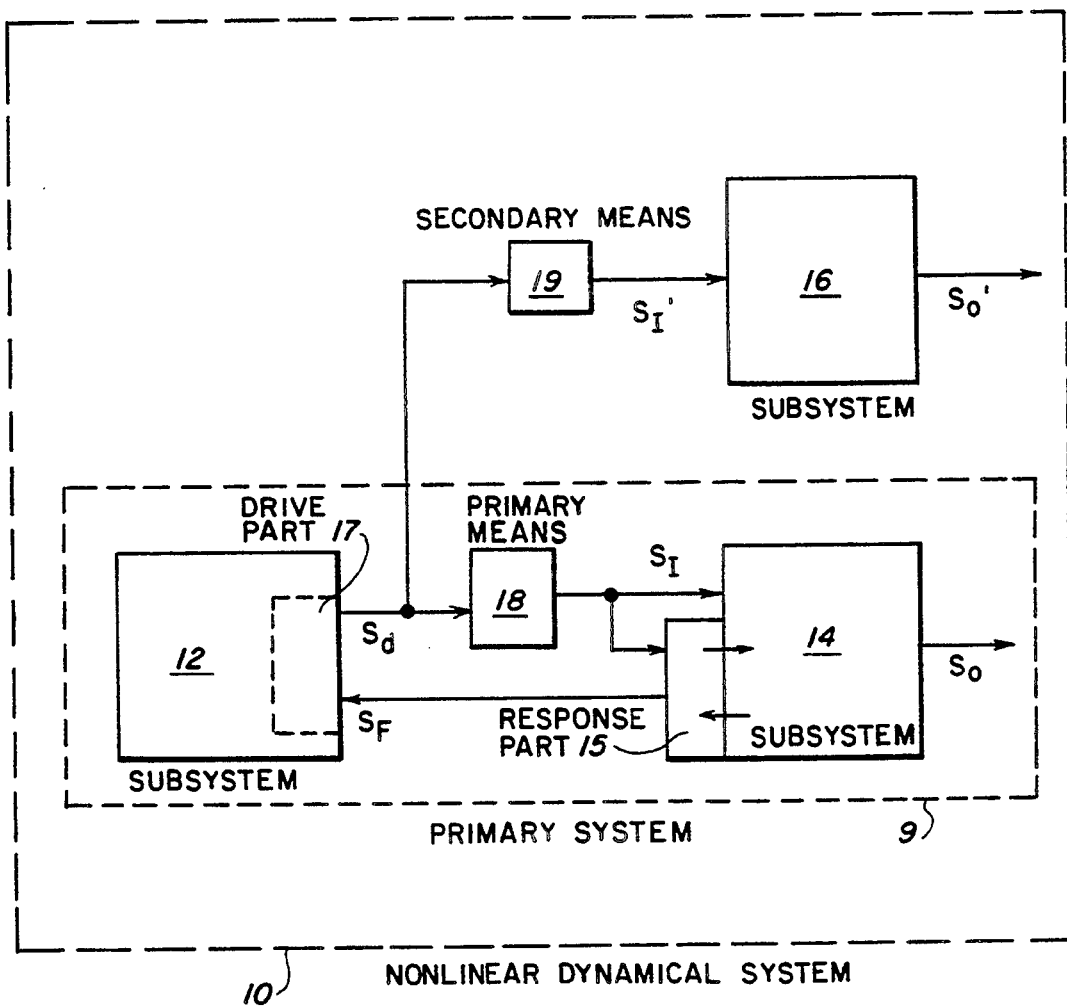
FIG. 6 is a general block diagram of an embodiment according to the present invention.

Since m-dimensional variable v may be dependent on (n-m)-dimensional variable w, there may be feedback from subsystem 14 to subsystem 12. As shown in FIG. 6, a response part 15 of subsystem 14 may produce a feedback signal $S_F$ responsive to the m-dimensional driving variable v, and a drive part 17 of subsystem 12 may respond to the feedback signal $S_F$ to produce the at least one drive signal $S_d$.

As shown in FIG. 6, subsystems 14 and 16 need not be driven by the same at least one drive signal $S_d$ but could be driven by at least one input signals $S_I$ and $S_I'$ responsive to the at least one drive signal $S_d$. System 10 could have primary and secondary means 18 and 19, respectively, coupled to subsystem 12 and responsive to the at least one drive signal $S_d$ for generating input signals $S_I$ and $S_I'$, respectively If these primary and secondary means 18 and 19, respectively are linearly responsive to the at least one drive signal $S_d$, then the above mathematical analysis would continue to apply since linear transformations do not affect the signs of the sub-Lyapunov exponents.

In accordance with the present invention, in order to develop electrical circuits, for example, which have chaotic dynamics, but which will synchronize, a nonlinear dynamical circuit (the driver subsystem) is duplicated (to form a response subsystem). A selected portion of the response circuit is removed, and all broken connections are connected to voltages produced at their counterparts in the drive circuit. These driving voltages constitute the at least one drive signal $S_d$ shown in FIG. 1, and advantageously are connected to the response circuit via a buffer amplifier to ensure that the drive circuit is not affected by the connection to the response circuit, i.e., it remains autonomous.

Figure 2:
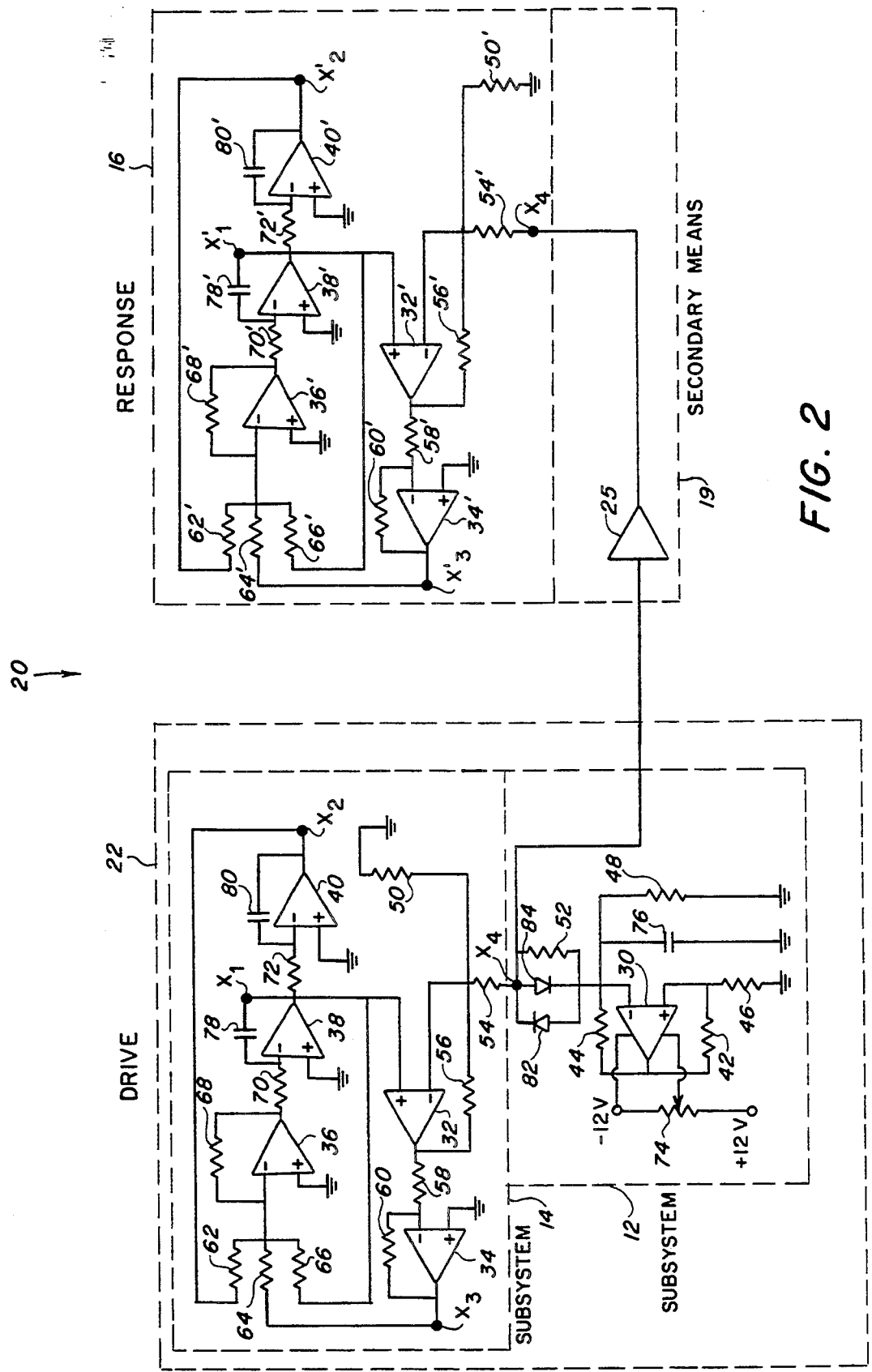
FIG. 2 is a schematic circuit diagram of a synchronized chaotic circuit system constructed in accordance with the present invention.

As a specific example, FIG. 2 shows an electrical circuit system 20 constructed in accordance with the present invention which has two synchronized nonlinear dynamical subsystems, a drive circuit 22 and a response circuit 16. Circuits 22 and 16 correspond to the u and w' systems, respectively, discussed above.

Drive circuit 22 comprises a hysteretic circuit formed by a differential amplifier 30, resistors 42, 44, 46, 48, 50 and 52; potentiometer 74; capacitor 76; and diodes 82 and 84 connected as shown; and an unstable oscillator circuit formed by differential amplifiers 32, 34, 36, 38 and 40; resistors 58, 60, 62, 64, 66, 68, 70 and 72; and capacitors 78 and 80 connected as shown. In an experimental implementation of circuit system 20 which has been successfully tested, amplifiers 30–40 were MM741 operational amplifiers, and diodes 82 and 84 were 1N4739A diodes. Component values for the resistors and capacitors which were used are set forth in the following table:

| | |
|---|---|
| Resistor 42 = 10 KΩ | Resistor 64 = 150 KΩ |
| Resistor 46 = 10 KΩ | Resistor 66 = 150 KΩ |
| Resistor 48 = 20 KΩ | Resistor 68 = 330 KΩ |
| Resistor 50 = 100 KΩ | Resistor 70 = 100 KΩ |
| Resistor 52 = 50 KΩ | Resistor 72 = 100 KΩ |
| Resistor 54 = 3 KΩ | Potentiometer 74 = 10 kΩ |
| Resistor 56 = 20 KΩ | Capacitor 76 = 0.01 μF |
| Resistor 58 = 100 KΩ | Capacitor 78 = 0.01 μF |
| Resistor 60 = 100 KΩ | Capacitor 80 = 0.001 μF |
| Resistor 62 = 220 KΩ | |

Drive circuit 22 can be subdivided into two subparts 14 and 12. Although the illustrative subparts 14 and 12 shown in FIG. 2 correspond to the two circuits forming drive circuit 22, this is not necessary, and the division of a given drive circuit into subparts in order to determine the proper configuration for a synchronized response circuit is made in accordance with the analysis described herein. Subpart 14 corresponds to the w subsystem (subsystem 14 in FIG. 1), subpart 12 corresponds to the v subsystem described above. Those parts of subpart 14 which affect the signal at X4 and those parts of subpart 12 responsive thereto, respectively, constitute response part 15 (FIG. 6) and drive part 17 (FIG. 6), to provide feedback. Response circuit 16 is substantially a duplicate of subpart 14 of drive circuit 22 (the specifications for primed components, such as resistor 50', is the same as the specification for unprimed components, such as resistor 50) and corresponds to subsystem w' (subsystem 16) described hereinabove. Signals $X_1$, $X_2$, $X_3$, and $X_4$ are characteristic voltages of drive circuit 22. The signal $X_4$ is connected as drive signal $S_d$ through a buffer amplifier 25, which ideally is an operational amplifier having linear characteristics such as an AD381 manufactured by Analog Devices, to response circuit 16 at the junction in circuit 16 corresponding to the junction in circuit 22 at which the signal $X_4$ is generated. Signal $X_4$ replaces the circuitry (subpart 12) of drive circuit 22 which is missing in response circuit 16. The subsystem of buffer amplifier 25 is the secondary means 19.

Drive circuit 22 is an autonomous system and behaves chaotically. It can be modeled by the following equations of motion for the three voltages $X_1$, $X_2$ and $X_3$ shown in FIG. 2.

$$\dot{X}_1 = X_2 + \gamma X_1 + cX_3$$

$$\dot{X}_2 = -\omega_2 X_1 - \delta_2 X_2$$

$$\epsilon \dot{X}_3 = (1 - X_3)^2(sX_1 - r + X_3) - \delta_3 X_3, \quad (9)$$

where $\gamma = 0.12$, $C = 2.2$, $\omega_2 = 10.0$, $\delta_2 = \delta_3 = 0.001$, $\epsilon = 0.001$, $s = 1/6$, and $r = 0.0$.

An analysis of the sub-Lyapunov exponents for the response circuit 16 requires a transformation of the equations of motion from the $(X_1, X_2, X_3)$ system to the $(X_1, X_2, X_4)$ system. This is done by analyzing the circuit, and finding that $X_3 = \alpha X_4 - \beta X_1$ where $\alpha = 6.6$ and $\beta = 7.9$. This gives the following equations of motion:

$$\dot{X}_1 = X_2 + \gamma X_1 + c(\alpha X_4 - \beta X_1)$$

$$\dot{X}_2 = -\omega_2 X_1 - \delta_2 X_2$$

$$\epsilon \dot{X}_4 = (1/\alpha)\{(1 - (\alpha X_4 - \beta X_1)^2)(sX_1 - r + \alpha X_4 - \beta X_1) - \delta_3 \alpha X_4 - \beta X_1 - \beta X_2 - \beta \gamma X_1 - \beta c(\alpha X_4 - \beta X_1)\} \quad (10)$$

The equations of motion for the response are just the $X_1$ and $X_2$ equations. The sub-Lyapunov exponents are calculated directly from the Jacobian of the $X_1$ and $X_2$ equations, which is a constant in this case. It will be appreciated that conventional methods for calculating Lyapunov exponents, as analytical, measurement, numerical and otherwise can be used, such as, for example, those described by Eckmann et al., Rev. Mod. Phys., Vol. 57, p. 617 et seq. (1985); Lichtenberg et al., *Regular and Stochastic Motion*, Springer-Verlag, New York (1983); Rashband, *Chaotic Dynamics of Nonlinear Systems*, John Wiley and Sons, New York (1990); and Wolf et al., *Physica*, Vol. 16D, p. 285 et seq. (1985). The sub-Lyapunov exponents in this case are $-16.587$ and $-0.603$, implying that synchronization of the two electrical circuits 22 and 16 will occur. $X_4$ is the drive signal $S_d$ for the response subsystems and ($X_1$, $X_2$) and ($X_1'$, $X_2'$) are the synchronized signals $S_o$ and $S_o'$.

Circuit 22 itself runs in the realm of a few hundred Hz. Response circuit 16 synchronizes with drive circuit 22 within about two milliseconds. It has been observed experimentally that small changes (~10%) of the circuit parameters do not affect synchronization greatly, in that the response voltages still remain close to their counterparts in drive circuit 22; but larger changes (~50%) do. Even though the sub-Lyapunov exponents for the larger changes both remain negative, the response voltages no longer remain close to their drive counterparts.

The circuit of FIG. 2 has been used to transmit a pure frequency signal hidden in a chaotic signal as follows. With circuits 22 and 16 operating in a synchronized mode, a sine wave of a few hundred Hz was added to the $X_2$ signal from the drive circuit and sent to the response circuit. The $X'_2$ signal produced by response circuit 16 was then subtracted from the sum of the $X_2$ signal and the sine wave, thereby extracting the sine wave from the chaotic signal. Spectral analysis of the ($X_2$+sine wave) combination signal showed that the sine wave could not be detected in the chaos of the $X_2$ signal. The smallest sine wave that could be extracted this way was approximately 40 millivolts peak to peak compared to a two volt peak to peak $X_2$ signal, or a 50:1 ratio of chaotic signal to sine wave.

Many other possible choices for the drive circuit are possible and may require transformation of the circuit equations to model them. This can be determined as described hereinabove for nonlinear circuits by analyzing the circuit dynamics in terms of the sub-Lyapunov exponents to determine which signal(s) to choose as a drive signal or signals, and which subcircuit is to be used as a model for the response circuit.

Figure 7:
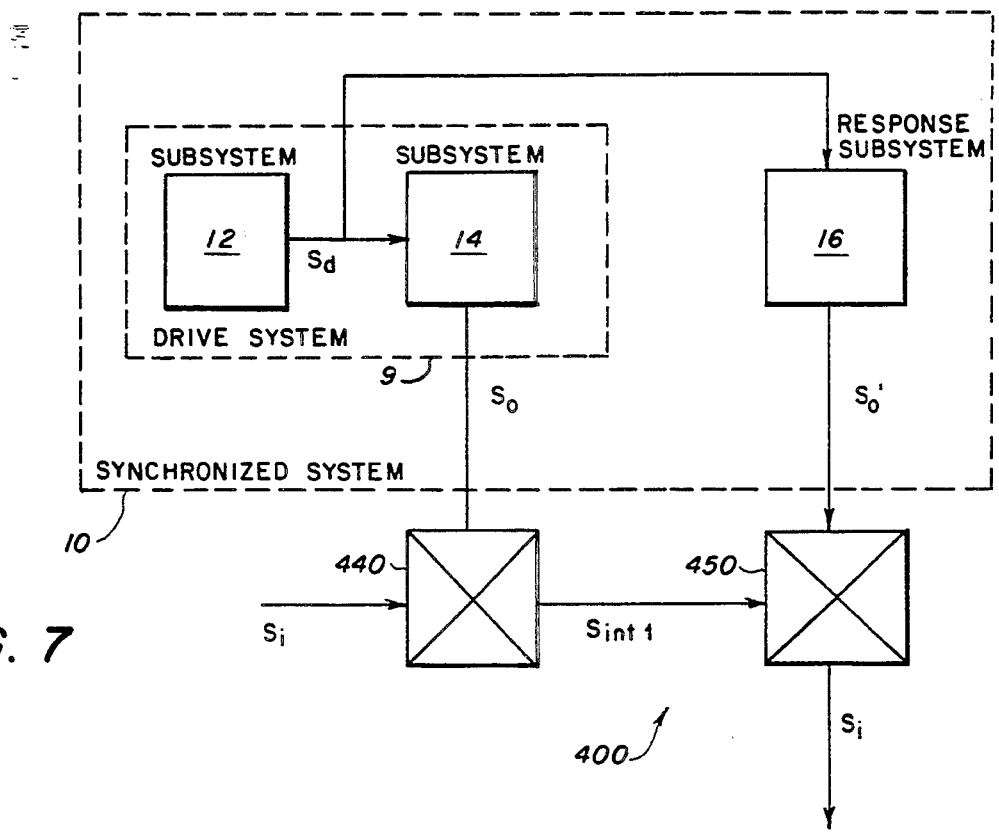
FIG. 7 is a general block diagram of an application of the present invention to encryption.

Referring to FIGS. 3–5 and 7–8, more practical communications systems for encrypted communication which incorporate and apply the synchronized system of FIGS. 1, 2 and 7 will now be described.

As shown in FIG. 7, the synchronized system 10 with drive system 9, subsystems 12 and 14 and response subsystem 16 form part of this system 400. A first combiner 440 coupled to subpart 14 then combines an information signal $S_i$ with the signal $S_o$ from subpart 14 to form at least one first intermediate signal $S_{int1}$. A driver 450 coupled to subpart 16 is responsive to the first intermediate signal $S_{int1}$ and the signal $S_o'$ from subpart 16 so as to derive the information signal $S_i$. It will be appreciated that other embodiments of synchronized system 10 discussed above, including those shown in FIG. 6, can be included in this encryption application.

Figure 3:
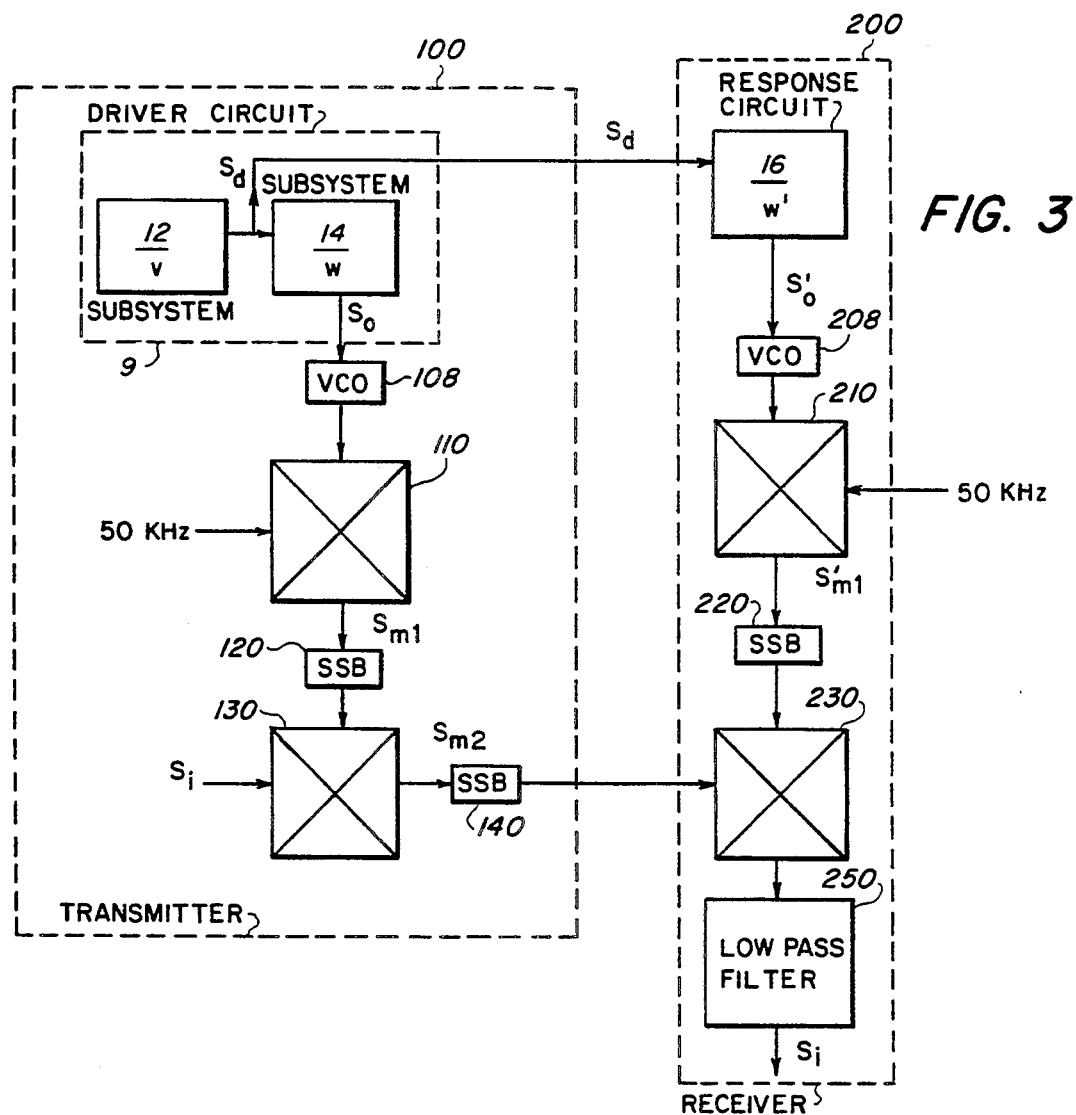
FIG. 3 is a first embodiment of an encrypted communication system constructed in accordance with the present invention which uses the system of FIG. 1.

As an example of the application shown in FIG. 7, referring to FIG. 3, driver circuit 9 of FIG. 1 forms part of a transmitter 100 and response circuit 16 of FIG. 1 forms part of a receiver 200. Drive signal(s) $S_d$ is(are) transmitted to response circuit 16 in any desired conventional wired or wireless fashion. Circuits 9 and 16 respectively generate low frequency synchronized chaotic signals $S_o$ and $S_o'$. Signals $S_o$ and $S_o'$ are respectively converted to frequency signals in amplitude to frequency converters 108 and 208 (e.g., voltage controlled oscillators), and the converted signals respectively combined in a multiplier 110 and a multiplier 210 with a 50 KHz carrier to produce first modulated chaotic signals $S_{m1}$ and $S_{m1}'$. (It will be appreciated that the transmission frequency is determined in accordance with the system requirements, the desired bandwidth, and the like. It will also be appreciated that if a circuit configuration is selected for driver circuit 9 and response circuit 16 which produces chaotic signals at a sufficiently high frequency, it is not necessary to modulate a separate carrier signal in order to obtain signals $S_{m1}$ and $S_{m1}'$.) The upper sideband of signal $S_{m1}$ is selected by a single sideband selector 120 and further modulated with an information signal $S_i$ of 600 Hz (a frequency within the range of signal $S_o$) in a multiplier 130 to produce a second modulated chaotic signal $S_{m2}$. The upper sideband of signal $S_{m2}$ is selected by a single sideband selector 140 and sent to receiver 200 in any conventional fashion, where it is modulated in a multiplier 230 by the upper side band of signal $S_{m1}'$ selected by a single sideband selector 220. The output of multiplier 230 consists of the sums and differences of the input frequencies. The difference part gives the information signal (~600 Hz) and the sum part gives a signal centered around 50 KHz. The output of multiplier 230 is filtered in a low bandpasts filter 250 to yield the demodulated information signal. It will be appreciated that information is effectively encrypted by being hidden in the chaotic signals which are transmitted. The at least one drive signal $S_d$ serves as a "key" to the receiver to extract the information from the chaos.

Figure 4:
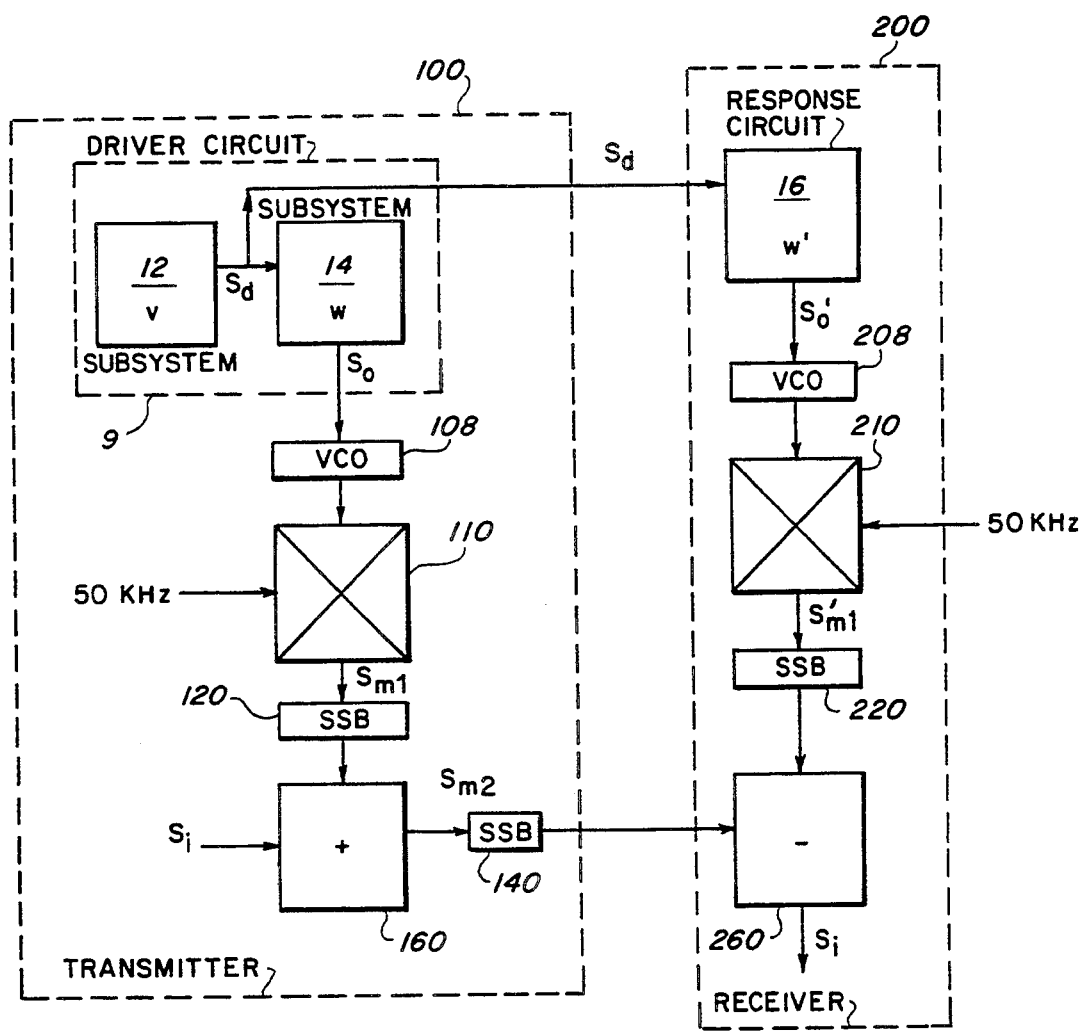
FIG. 4 is a second embodiment of an encrypted communication system constructed in accordance with the present invention which uses the system of FIG. 1.

The communication system of FIG. 4 is similar to that of FIG. 3, except that the information signal $S_i$ is added to the upper side-band of signal $S_{m1}$ in an adder 160, and the upper side-band of signal $S_{m1}'$ is subtracted from the transmitted form of signal $S_{m2}$ in a subtractor 260 in receiver 200.

Figure 8:
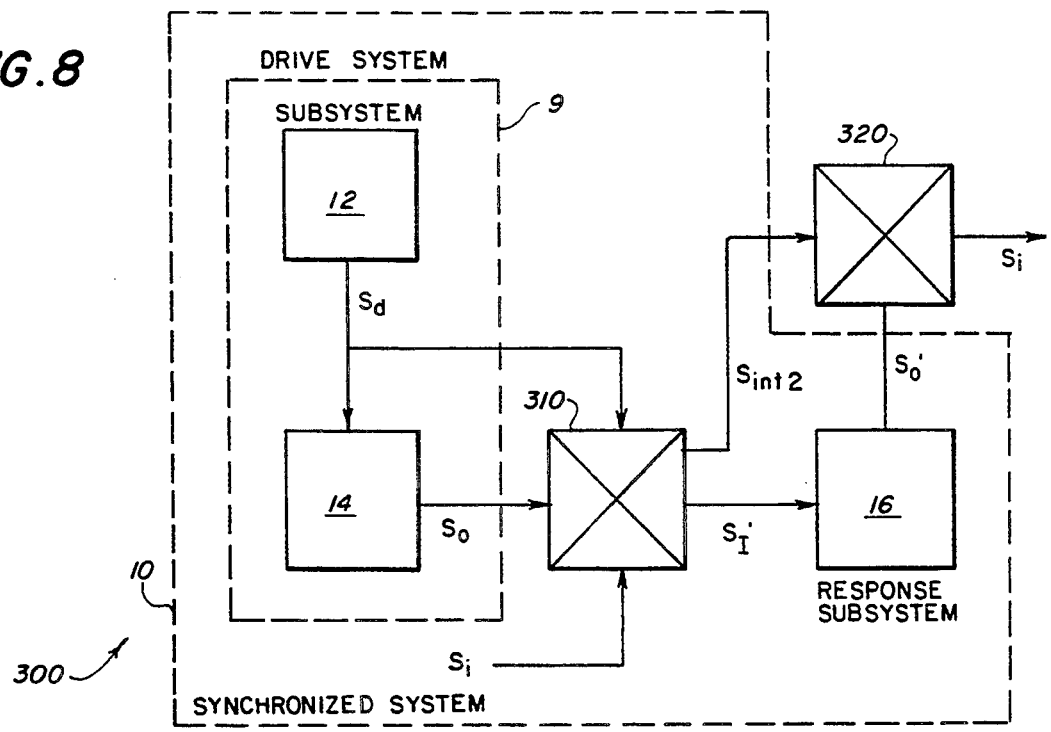
FIG. 8 is a general block diagram of another application of the present invention to encryption.

FIG. 8 shows another application of the present invention to communication encryption. This embodiment differs from that shown in FIG. 7 in that the information signal $S_i$ is added to the signal driving subsystem 16. The synchronized system 10 with drive system 9, subsystems 12 and 14, and response system 16 form part of this system 300. A second combiner 310 corresponds to the secondary means 19. It combines the at least one drive signal $S_d$, output $S_o$ from subpart 14 and an information signal $S_i$ to produce at least one second intermediate signal $S_{int2}$ and at least one input signal $S_i'$. A second driver 320 coupled to subpart 16 is responsive to the at least one second intermediate signal $S_{int2}$ and signal $S_o'$ from subpart 16 so as to derive the information signal $S_i$.

Figure 5:
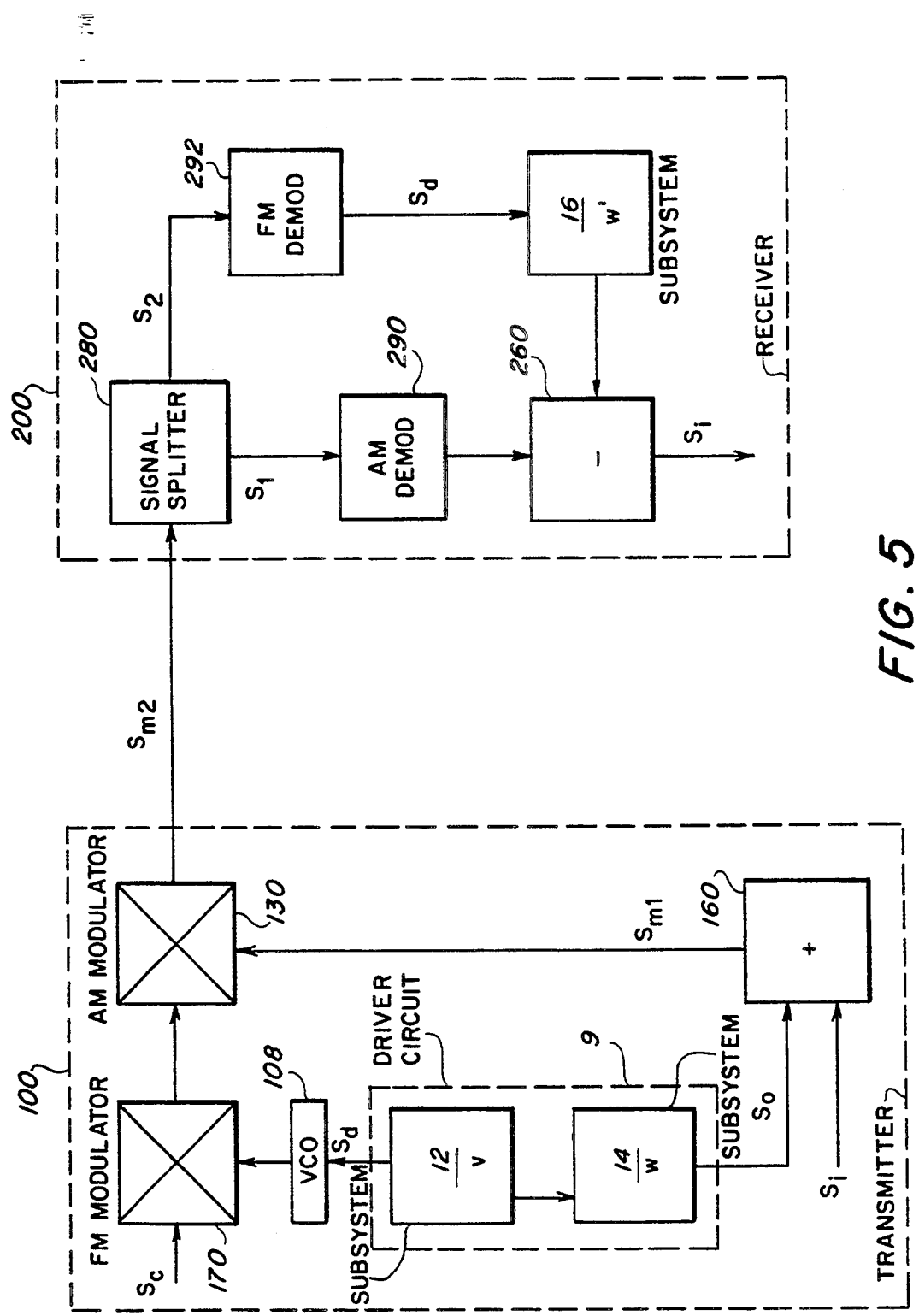
FIG. 5 is a third embodiment of a communication system constructed in accordance with the present invention which the system of FIG. 1.

An example of the system shown in FIG. 8 is shown in FIG. 5, in which at least one drive signal $S_d$ and the information carrying chaotic carrier signal are transmitted as part of a pure frequency carrier which is frequency modulated with at least one drive signal $S_d$ and amplitude modulated with the chaotic carrier signal. Specifically, transmitter 100 comprises a frequency modulation (FM) modulator 170 for modulating a pure frequency carrier $S_c$ having a frequency higher than any frequencies found in the at least one drive signal $S_d$ and the modulated chaotic carrier signal with at least one drive signal $S_d$; an adder 160 for adding an information signal $S_i$ to signal $S_o$ to produce first modulated signal $S_{m1}$; and a multiplier 130 for amplitude modulation of the output of modulator 170 with signal $S_{m1}$ to produce a second modulated signal $S_{m2}$ for transmission to receiver 200. Receiver 200 comprises a signal splitter 280 for dividing the received signal $S_{m2}$ into two equal signals $S_1$ and $S_2$; an amplitude demodulator 290 for amplitude demodulating signal $S_1$ and a frequency demodulator 292 for frequency demodulating signal $S_2$. The output of demodulator 292 is fed as at least one drive signal $S_d$ to response circuit 16, and the outputs of demodulator 290 and response circuit 16 are subtracted in a subtractor 260 to extract the information signal $S_i$.

It will be appreciated that variants of the foregoing methods are possible. For example, two modulated chaotic carrier signals $S_{m21}$ and $S_{m22}$ with low mutual correlations can be produced and combined in transmitter 100 and the information on each carrier can be separated in receiver 200 by multiplication of the received signals corresponding to $S_{m21}$ and $S_{m22}$ with the synchronized counterparts $S_{m11}'$ and $S_{m12}'$ of the chaotic carrier signals $S_{m11}$ and $S_{m12}$, and filtering the resultant signals with a low pass filter as in the embodiment of FIG. 3.

It will also be appreciated that the present invention as described previously is applicable to any system which requires synchronization of remote signals and- /or their low correlation with each other. For example, the present invention is particularly suited for use in control devices relying on wide-frequency-band synchronized signals.

Similar principles as discussed previously can be applied to cascaded subsystems which allow the multiple signals to be synchronized. In the following discussion we build on the previously discussed design of synchronized subsystems by cascading two or more subsystem responses, i.e., using a signal produced by a subsystem to drive another subsystem.

The objective here is to get a synchronization of the response with its counterpart in the drive system but to build a response setup which produces signals in synchronization with one or more of the original input drive signals. We can use this new synchronization signal to process the original input drive, to detect parameter changes between the drive system and the responses, and to detect other information transmitted along with the output of the drive system.

Figure 9A:
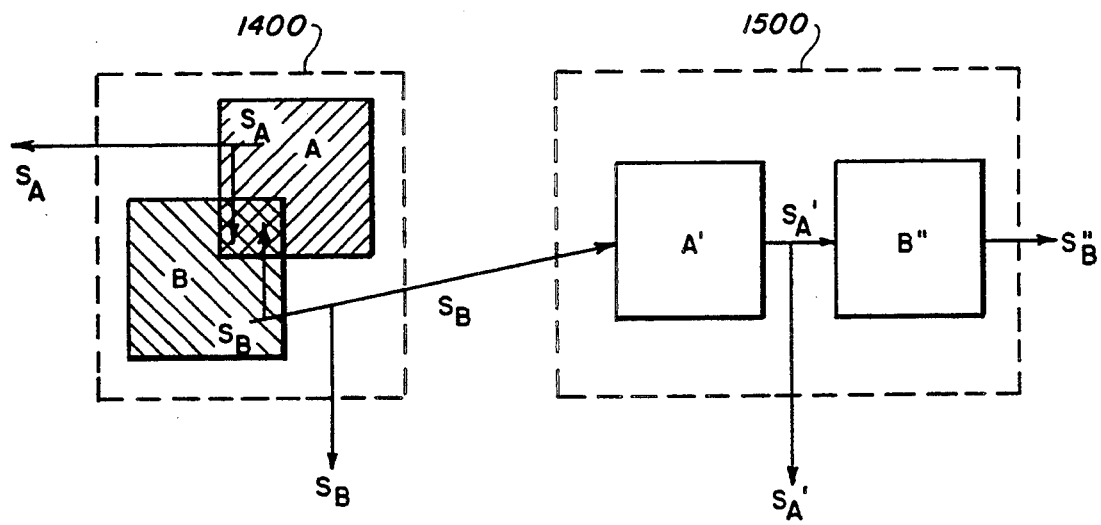
FIGS. 9A and 9B illustrate a cascaded synchronized system with two stages.

FIG. 9A illustrates a cascaded system having a transmitter 1400 and a cascaded receiver 1500. The transmitter 1400 includes two subsystems A and B which are interdependent and may or may not overlap. Neither subsystem A nor subsystem B is contained within the other system. In other words, at least part of subsystem A is external to subsystem B and at least part of subsystem B is external to subsystem A. Subsystem A drives subsystem B with signal $S_A$ and subsystem B drives subsystem A with signal $S_B$. The receiver 1500 produces a signal $S_{B''}$ which is to be synchronized with a signal $S_B$ produced in the transmitter 1400. The subsystem B of transmitter 1400 transmits a drive signal $S_B$ to the receiver 1500. The receiver 1500 includes two subsystems A' and B'' that are cascade connected., i.e., the subsystem A' drives the subsystem B'' and the subsystem B'' does not directly drive the subsystem A'. As in the single stage subsystems discussed earlier (see FIG. 1), subsystems A' and B'' are duplicates of subsystems A and B, respectively, which have all-negative sub-Lyapunov exponents.

The subsystem A' receives the drive signal $S_B$ and provides a response signal $S_{A'}$ to the subsystem B''. The subsystem B'' in turn produces signal $S_{B''}$ in synchronization with signal $S_B$. Unlike the single stage synchronization systems discussed earlier (see FIG. 1), in the cascade system shown in FIG. 9A, the same signal $S_B$ which the receiver 1500 synchronizes with respect to is also used to drive the receiver 1500. In the single stage synchronization system 10 of FIG. 1, the synchronized signal $S_o$ may be different than the drive signal $S_d$.

The receiver 1500 with the cascaded subsystems A' and B'' is not only capable of producing the signal $S_{B''}$ synchronized with the signal $S_B$ but is also capable of producing the signal $S_{A'}$ which is in synchronization with the signal $S_A$. Because the signal $S_{B''}$ can be compared to the signal $S_B$, the fact of synchronization can be clearly determined allowing those on the receiver side to rely on the synchronization of the $S_B$ and $S_{B''}$ signals in concluding that signal $S_{A'}$ is in synchronization with signal $S_A$.

Figure 9B:
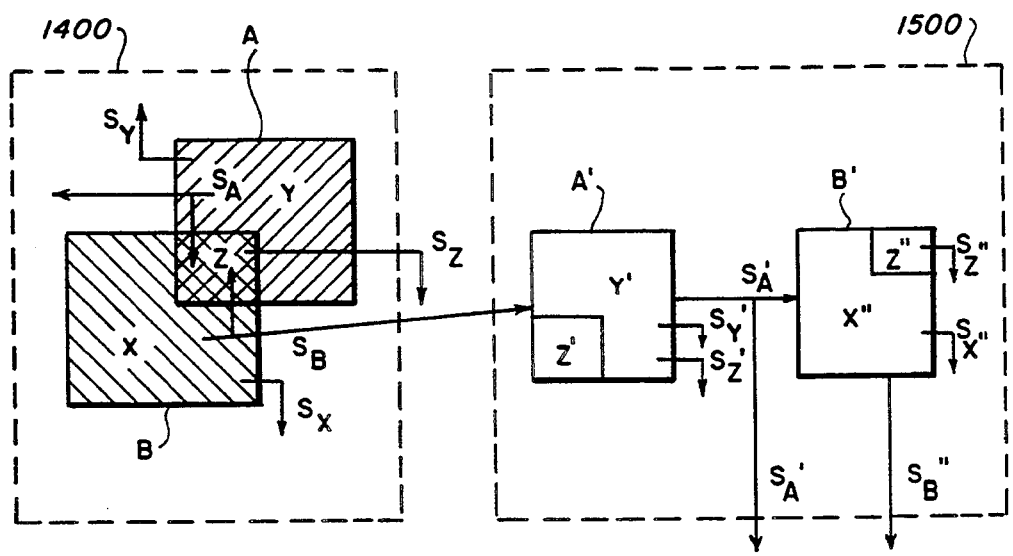

FIG. 9B illustrates a cascaded system as in FIG. 9A in more detail and where the transmitting system is a 3-dimensional system 1400. Since the transmitting system 1400 is 3-dimensional, 3 dynamic state variables are needed to define the state of the system. The transmitting system is divided into three interdependent systems X, Y and Z with produce signals $S_X$, $S_Y$, and $S_Z$, respectively, signals $S_X$, $S_Y$, and $S_Z$ being representative of the 3 dynamic state variables. The elements Y and Z correspond to subsystem A in FIG. 9A and the elements X and Z correspond to the subsystem B in FIG. 9A. Subsystem A drives subsystem B with signal $S_A$ and subsystem B drives subsystem A with signal $S_B$. The signals $S_X$ and $S_B$ are directly related and may be considered interchangeable in this discussion. The signals $S_Y$ and $S_A$ are also directly related and they also may be considered interchangeable in this discussion.

An example of an appropriate three-dimensional system is the Rikitake Two-Disc Dynamo (A. E. Cook and P. H. Roberts, Proc. Camb. Phil. Soc., 1970, 68, 547–569) modeled by the following set of differential equations:

$$\frac{dx}{dt} = -\mu x + zy \quad (11)$$

$$\frac{dy}{dt} = -\mu y + (z - A)x$$

$$\frac{dz}{dt} = 1 - xy.$$

Typical parameters are $\mu = 1.0$, $A = 3.75$. Such a system is chaotic, since it has at least one positive exponent and two stable subsystems. Subsystem A produces signals $S_y$ and $S_z$ and drives subsystem B with signal $S_A = S_y$. Subsystem B produces signals $S_x$ and $S_z$ and drives subsystem A with signal $S_B = S_x$. Subsystems A and B have sub-Lyapunov exponents of $(-0.22, -0.55)$ and $(-0.49, -0.51)$, respectively.

Another example to consider is a system modeled by the following Lorenz equations:

$$\frac{dx}{dt} = \sigma(y - x) \quad (12)$$

$$\frac{dy}{dt} = -xz + rx - y$$

$$\frac{dz}{dt} = xy - bz.$$

For $\sigma=10$, $b=8/3$, and $r=60$, this system operates in the chaotic regime, and subsystems producing variables (y,z) and (x,z) have sub-Lyapunov exponents of ($-1.81$, $-1.86$) and ($-2.67$, $-9.99$), respectively. For $\sigma=16$, $b=4$, and $r=45.92$, this system operates in the chaotic regime, and subsystems producing variables (y,z) and (x,z) have sub-Lyapunov exponents of ($-2.5$, $-2.5$) and ($-3.95$, $-16.0$), respectively.

Because of the nature of nonlinear dynamical systems driven in the chaotic regime, properties of one chaotic system do not necessarily carry over to another chaotic system. Nevertheless, the present invention applies to any chaotic system in general, and in particular, to non-Lorenzian systems and non-Chua systems (L. Kocarev et al., "Experimental Demonstration of Secure Communications Via Chaotic Synchronization," International Journal of Bifurcation and Chaos, Vol. 2, No. 3, (1992) 709–713; U. S. Parlitz et al., "Transmission of Digital Signals By Chaotic Synchronization", International Journal of Bifurcation and Chaos, Vol. 2, No. 4, (1992) 973–977) so long as the chaotic system includes at least two stable subsystems.

The drive signal $S_B$ is transmitted to the receiver 1500 which includes two subsystems A' and B" each with elements that are interdependent. Specifically, subsystem A' is a duplicate of subsystem A of transmitter 1400, and subsystem B' is a duplicate of subsystem B of transmitter 1400. The subsystems A' and B" of receiver 1500 include elements Y', Z', X" and Z" which are duplicates of to the corresponding elements in the transmitter 1400. Note that the X' element is missing from the first subsystem A' and the Y" element is missing from the second subsystem B". The subsystems A' and B" produce responses $S_{A'}$ and $S_{B''}$, respectively, where signal $S_{B''}$ is in synchronization with the drive signal $S_B$, and signal $S_{A'}$ is in synchronization with signal $S_A$ of the transmitter 1400. Receiver 1500 also produces signals $S_{X''}$, $S_{Y'}$, $S_{Z'}$ and $S_{Z''}$ which are in synchronization with signals Sx", Sy', Sz' and Sz", respectively, of the transmitter 1400. By using a conventional comparator, signals $S_{B''}$ and $S_B$ can be compared at the receiver 1500 to confirm that signals $S_A$, $S_{X''}$, $S_{Y'}$, $S_{Z'}$ and $S_{Z''}$ are also synchronous.

The two response signals or outputs $S_{A'}$ and $S_{B''}$ are produced as follows. The first subsystem A' accepts the input signal $S_B$ and produces its response signal $S_{A'}$ in synchronization with its counterpart ($S_A$) in the transmitter 1400. The second subsystem B" is driven by signal $S_{A'}$ from the first subsystem A'. The second subsystem response $S_{B''}$ produces signal $S_{B''}$ in synchronization with its counterpart $S_B$ in the transmitter 1400, which in this case is the original drive signal $S_B$ coming from the element B. The subsystems A' and B" are selected so that all of the essential elements of the transmitter 1400 that are not present in the first subsystem A' are present in the second subsystem B" and vice-versa. In other words, the logical union of subsystems A' and B" includes all of the essential elements of the transmitter 1400.

It is to be noted that each subsystem A' and B" in the receiver 1500 is driven by a signal which supplies information in the complete system 1400 which is lacking in the driven subsystem. Thus, subsystem A' in the receiver 1500 is driven by the same signal $S_B$ that drives subsystem A in the transmitter 1400, Subsystem B" in the receiver 1500 is driven by signal $S_{A'}$ produced by subsystem A', just as subsystem B in the transmitter 1400 is driven by signal $S_A$ produced by subsystem A.

As discussed earlier, subsystems A, A', B and B" must have all-negative sub-Lyapunov exponents. In other words, subsystems A, A', B and B" are stable subsystems.

The same principles discussed above concerning cascaded systems with 2 subsystems apply equally well to cascaded systems with more than 2 subsystems. In particular, each of the cascaded subsystems in the receiver is a duplicate of a stable subsystem in the transmitter. Each subsystem in the receiver is driven by a signal which supplies information from the complete system that is lacking in the driven subsystem, in particular, by a signal corresponding to the signal which drives the corresponding subsystem in the transmitter.

Figure 10:
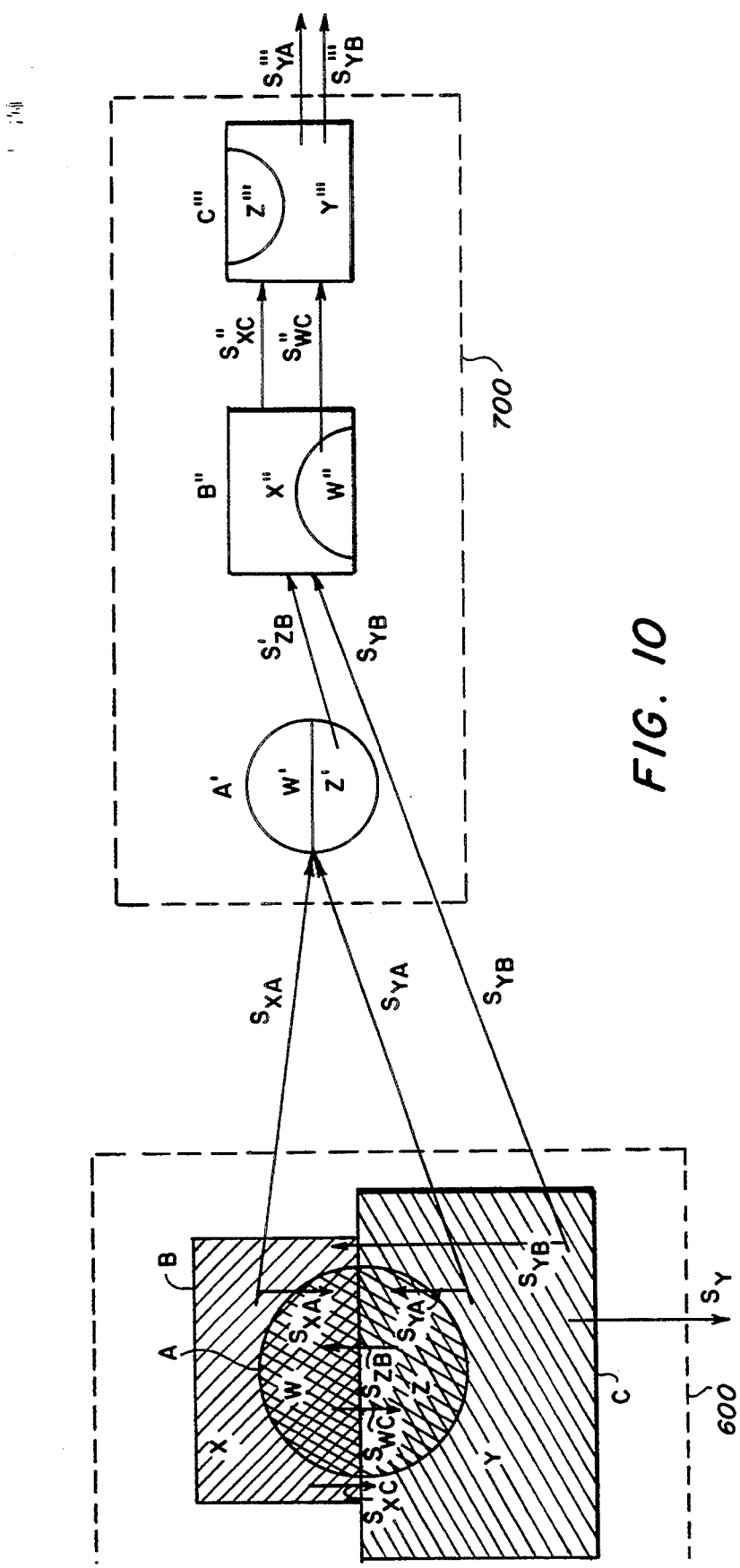
FIG. 10 depicts a cascaded system with three stages allowing multiple signals to be synchronized and synchronization to be verified.

Turning now to FIG. 10, an example of three cascaded subsystems is shown. In this arrangement the transmitter 600 is broken up into 3 subsystems A, B and C. Subsystem A includes elements W and Z; subsystem B includes elements W and X; and subsystem C includes elements Y and Z. Subsystem A is driven by signals $S_{XA}$ and $S_{YA}$; subsystem B is driven by signals $S_{YB}$ and $S_{ZB}$; and subsystem C is driven by signals $S_{XC}$ and $S_{WC}$. Subsystems A, B and C each have all negative sub-Lyapunov exponents.

The first stage of a cascaded receiver 700 is a subsystem A' which is a duplicate of subsystem A in the transmitter 600. It includes elements W' and Z'. The transmitter 600 drives the subsystem A' with signals $S_{XA}$ and $S_{YA}$ which may in fact constitute a single signal (not shown). As so driven, the first stage A' produces a signal $S_{ZB'}$ which is in synchronization with signal $S_{ZB}$ produced in element Z of subsystem A in the transmitter 600. The second stage of the cascaded receiver 700 is a subsystem B" which is a duplicate of subsystem B in the transmitter 600. It includes elements W" and X". The transmitter 600 and the first stage A' drive the second stage B" with signals $S_{YB}$ and $SS_{ZB'}$, respectively. As so driven, the second stage B" produces signals $S_{WC'}$ and $S_{XC'}$, which are synchronous with signals $S_{WC}$ and $S_{XC}$, respectively, produced in subsystem B of the transmitter 600. The third stage C''' of the cascaded receiver 700 is a subsystem C''' which is a duplicate of subsystem C in the transmitter 600. It includes elements Y''' and Z'''. The second stage B" drives the third stage C''' with signals $S_{WC'}$ and $S_{XC'}$. The receiver 700 is cascaded since the first stage A' drives the second stage B" and the second stage B" drives the third stage C''' and since the second stage B" does not directly drive the first stage A' and the third stage C''' does not directly drive the second stage B". As so driven, the third stage C''' produces signals $S_{YA'''}$ and $S_{YB'''}$ which are synchronous with signals $S_{YA}$ and $S_{YB}$ of the transmitter 600. Although not shown, the receiver 700 can produce additional signals such as $S_{WC}$, $S_{XA''}$, and $S_{ZB'''}$ which are synchronous with signals $S_{WC}$, $S_{XA}$, and $S_{ZB}$ produced by the transmitter 600. The signals $S_{YA'''}$, $S_{YB'''}$ as well as $S_{XA''}$ produced by the receiver 700 can be compared with the corresponding signals produced by the transmitter 600 to confirm synchronization.

To understand the theory behind the cascaded systems of FIGS. 9A, 9B and 10 we build on the previous discussion of equations 1–3. Once the first subsystem of the receiver is created we create a second system, say modeled by the set of differential equations r=a(r,s) and s=b(r,s), where r and s are subsets of variables of u in the same way that v and w are subsets of variables of u. The r variables are the drives for the second subsystem just as the v variables were for the first subsystem. The functions a and b are the corresponding vector field components. If this second subsystem is a stable subsystem (See Pecora et al., Synchronization in Chaotic Systems, Physical Review Letters, Vol. 64, No. 8, February 1990 and Pecora et al., Driving Subsystems With Chaotic Signals, Physical Review A, Vol. 44, No. 4, August 1991, both incorporated by reference herein, for a discussion of how to determine whether stability exists), we will have synchronization of the s variables with their corresponding variables in the first system and with the drive signal. This then provides a signal in synchronization with the input drive (one or more of the variables).

For any two dynamical systems to become synchronized, they must start in the same basin of attraction. That is, their starting points (initial conditions) must be in the same set of points which will converge to the same attractor. Since many dynamical systems can have more than one attractor, it is possible for two such systems to start in different basins.

If the response subsystem has somewhat different parameters than the drive system, the synchronized signals will not be exactly equal and in general will have a difference which at small parameter changes will be proportional to the derivative of the vector fields with respect to the parameters. As we discuss below, this effect along with others in the dynamical system allows communication using signals from nonlinear systems, including chaotic ones.

We now discuss the details of cascaded synchronized systems and the circuit design, construction, and operation thereof.

Figure 11:
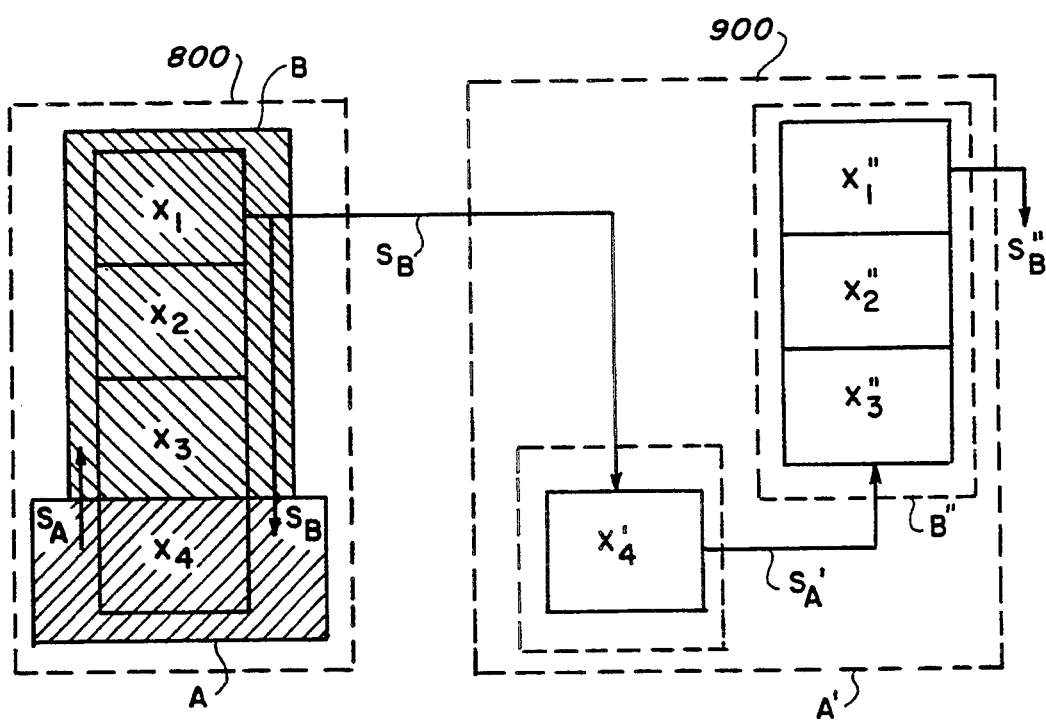
FIG. 11 depicts an embodiment of a two stage cascaded synchronization system.

FIG. 11 functionally illustrates an example of a cascaded system. It includes a transmitter 800 which includes elements $X_1$, $X_2$, $X_3$, and $X_4$ characterized by state variables $x_1$, $x_2$, $x_3$ and $x_4$, respectively. Element $X_4$ constitutes subsystem A, and elements $X_1$, $X_2$, $X_3$ constitutes subsystem B. Both subsystems A and B are stable, that is they have all negative sub-Lyapunov exponents. Subsystem A drives subsystem B with signal $S_A$ and subsystem B drives subsystem A with signal $S_B$. The receiver 900 is a cascade of two subsystems A' and B'' where the first subsystem system A' includes a single element $X_{4'}$ and the second subsystem B'' includes three elements $X_{1''}$, $X_{2''}$ and $X_{3''}$. The receiver 900 is a cascaded receiver since the first subsystem A' drives the second subsystem B'' and the second subsystem B'' does not directly drive the first subsystem A'. The first subsystem A' is a duplicate of the subsystem A in the transmitter 800 and the second subsystem B'' is a duplicate of the subsystem B in the transmitter 800. The transmitter 800 drives the first subsystem A' with signal $S_B$ and the first subsystem A' drives the second subsystem B'' with signal $S_{A'}$. The second subsystem B'' produces an output signal $S_{B''}$ in synchronization with drive signal $S_B$.

The operation of the elements in this example is modeled by the following equations:

$$dx_1/dt = -\alpha_1[-\beta_1 A_1 x_1 - \gamma_1 x_2 + x_3 - x_4 + g_1(x_4) + \delta x_1], \quad (13)$$

$$dx_2/dt = -\alpha_2(x_1 + \delta x_2), \quad (14)$$

$$dx_3/dt = -\alpha_3(x_2 + \delta x_3), \quad (15)$$

$$dx_4/dt = -\alpha_4((-\beta_4/R_\nu)x_1 + \gamma_4 A_4 x_4 + g_2(x_4)), \quad (16)$$

$$dx''_1/dt = -\alpha_1[\beta_1 A''_1 x''_1 - \gamma_1 x''_2 + x''_3 - x'_4 + g_1(x'_4) + \delta x''_1], \quad (17)$$

$$dx''_2/dt = -\alpha_2(x''_1 + \delta x''_2), \quad (18)$$

$$dx''_3/dt = -\alpha_3(x''_2 + \delta x''_3), \quad (19)$$

$$dx'_4/dt = -\alpha_4((-\beta_4/R_\nu)x_1 + \gamma_4 A'_4 x'_4 + g_2(x'_4)), \quad (20)$$

where the $g_1$ and $g_2$ functions are defined as:

$$g_1(x) = \beta_5(|x-2.5| - |x+2.5|), \quad (21)$$

$$g_2(x) = \beta_6 x + \gamma_6(|x-1.3| - |x+1.3|) + \epsilon(|x-2.6| - |x+2.6|) \quad (22)$$

and the constants are $\alpha_1 = 1098$, $\alpha_2 = 10980$, $\alpha_3 = 4972$, $\alpha_4 = 10980$, $\beta_1 = 1.466$, $\gamma_1 = 2.466$, $\beta_4 = 10^5$, $\gamma_4 = 0.5$, $\beta_5 = 0.5$, $\beta_6 0.5$, $\gamma_6 = 0.164$, and $\epsilon_6 = 0.361$. The constant $\delta$, set at 0.2, is a phenomenological damping constant used to account for leakage current in the capacitors. Its value was set to make the stability of eqns. (13)–(22) match the stability of the actual circuit. $A_1$ and $A_4$ are variable parameters normally set at 1.0.

As $R_\nu$ is decreased from 50,000 ohms to 46,000 ohms, the circuit goes from a limit cycle through a period doubling to a one-well chaotic attractor to a two-well chaotic attractor. With $R_\nu$ held constant the transmitter 800 and receiver 900 can produce a number of synchronized signals with the output $S_{B''}$ of the element B'' being used to confirm synchronicity as previously discussed. If $R_\nu$ is varied information can be transferred as will be discussed in detail with respect to FIGS. 20–27.

Figure 12:
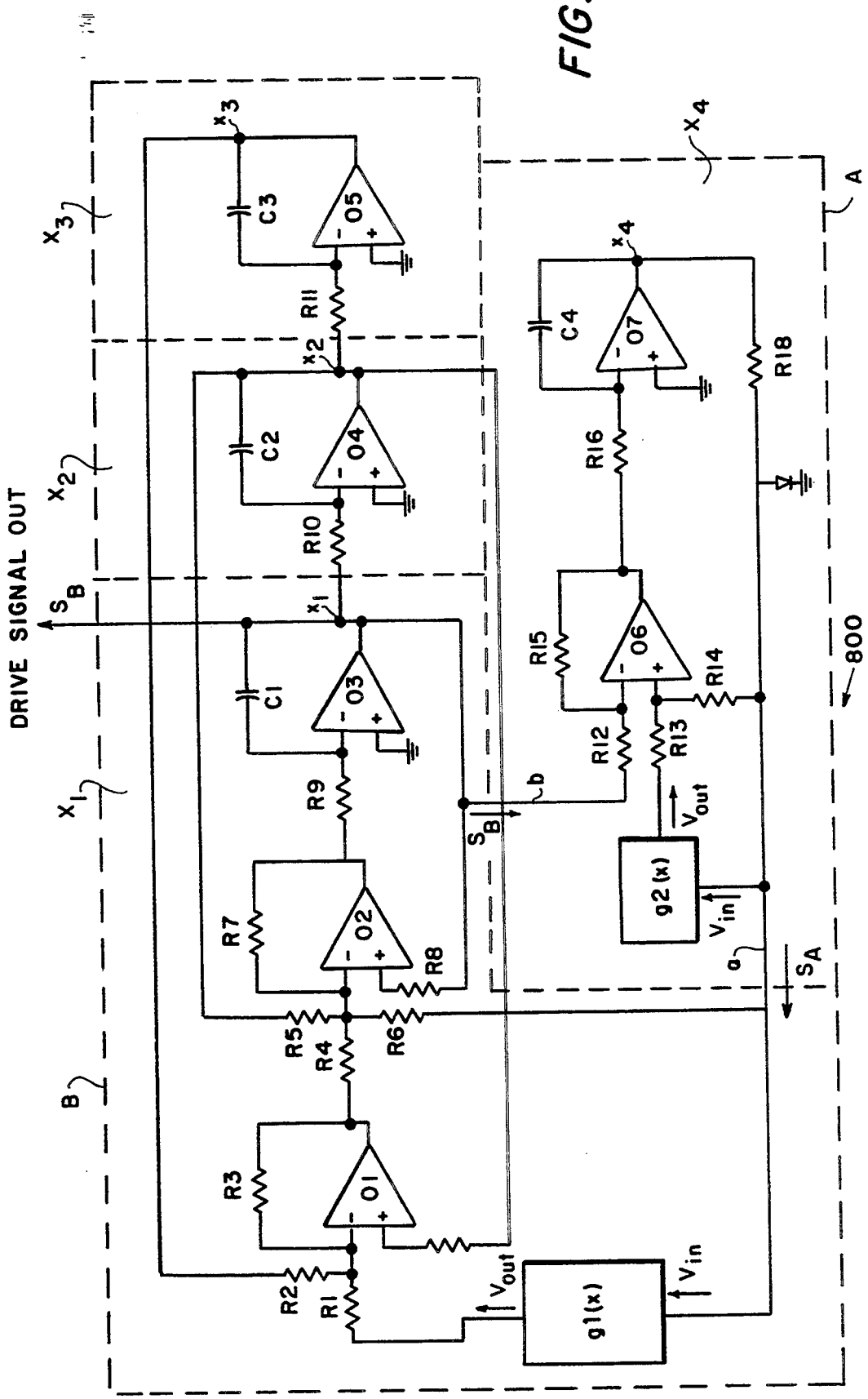
FIGS. 12–15 illustrate the circuit details of the FIG. 11 embodiment.

FIGS. 12–15 illustrate the circuit details of an example of a system of FIG. 11 where multiple synchronized signals can be produced and synchronization verified. FIG. 12 depicts the details of the transmitter 800. This circuit 800 includes the following particular circuit elements:

| | |
|---|---|
| Resistor R1 = 100 kΩ | Resistor R11 = 221 kΩ |
| Resistor R2 = 100 kΩ | Resistor R12 = $R_\nu$ |
| Resistor R3 = 100 kΩ | Resistor R13 = 100 kΩ |
| Resistor R4 = 100 kΩ | Resistor R14 = 200 kΩ |
| Resistor R5 = 68.2 kΩ | Resistor R15 = 100 kΩ |
| Resistor R6 = 100 kΩ | Resistor R16 = 100 kΩ |
| Resistor R7 = 100 kΩ | Resistor R17 = 100 kΩ |
| Resistor R8 = 68.2 kΩ | Resistor R18 = 100 Ω |
| Resistor R9 = 1 MΩ | |
| Resistor R10 = 100 kΩ | |
| Capacitor C1 = 910 pf | Capacitor C3 = 910 pf |
| Capacitor C2 = 910 pf | Capacitor C4 = 910 pf. |

$R_\nu$ is selected from among 47.8 kΩ and 46.9 kΩ with 47.8 kΩ preferable. Resistor tolerances are preferably 1% and all capacitors are preferably 5% mica capacitors. The system also includes operational amplifiers 01, 02, 03, 04, 05, 06 and 07 all of which are 741 type amplifiers and diode DO which is an IN485B type. The circuit details of the functions g1(x) (eqn. 21) and g2(x) (eqn. 22) are depicted in the circuit diagrams of FIGS. 13 and 14, respectively.

Returning now to the example shown in FIG. 12, if one cuts the circuit at points a and b, the resulting systems A and B are stable. Subsystem B consisting of $X_1$, $X_2$, and $X_3$ can be driven with the $S_A$ signal from the full system. Subsystem A consisting of $X_4$ may be driven with the $S_B$ signal from the full circuit. When driving the B subsystem including elements $x_1$, $x_2$, and $x_3$, it does not actually matter whether the $S_A$ driving signal is coming from the full circuit or from an A (or A') subsystem synchronized to the full circuit. Conversely, when driving the A subsystem, it does not actually matter whether the $S_B$ driving signal is coming from the full circuit or from a B or B" subsystem synchronized to the full circuit. This arrangement, in which the stable subsystems are driven by signals from subsystems and not necessarily the full circuit, is called "cascaded synchronization".

Figure 13:
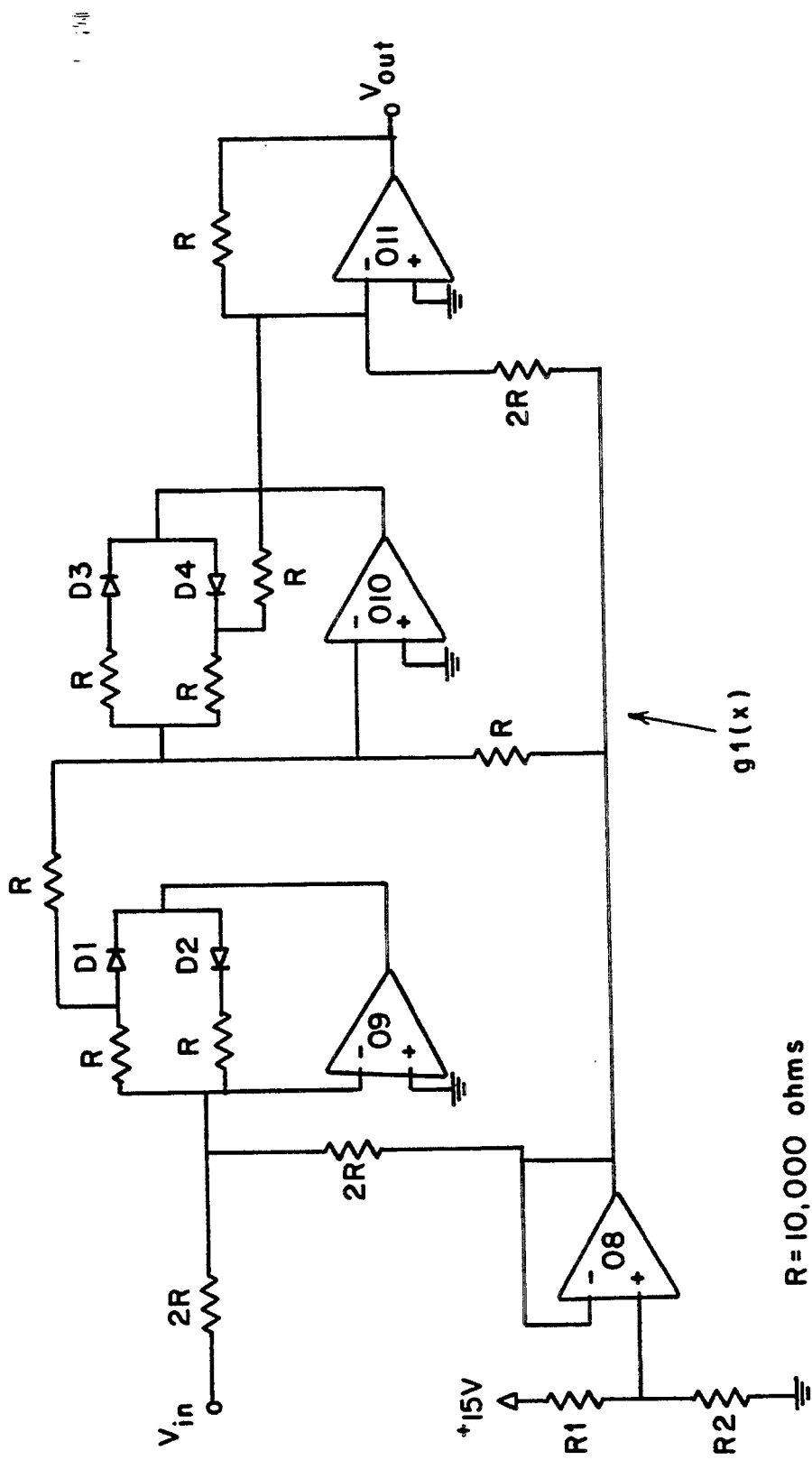

FIG. 13 depicts a circuit with response g1(x) (eqn. 21). In this circuit the resistors R=10 kΩ, the operational amplifiers 08, 09, 010 and 011 are 741 types and the diodes D1, D2, D3 and D4 are preferably type IN485B.

Figure 14:
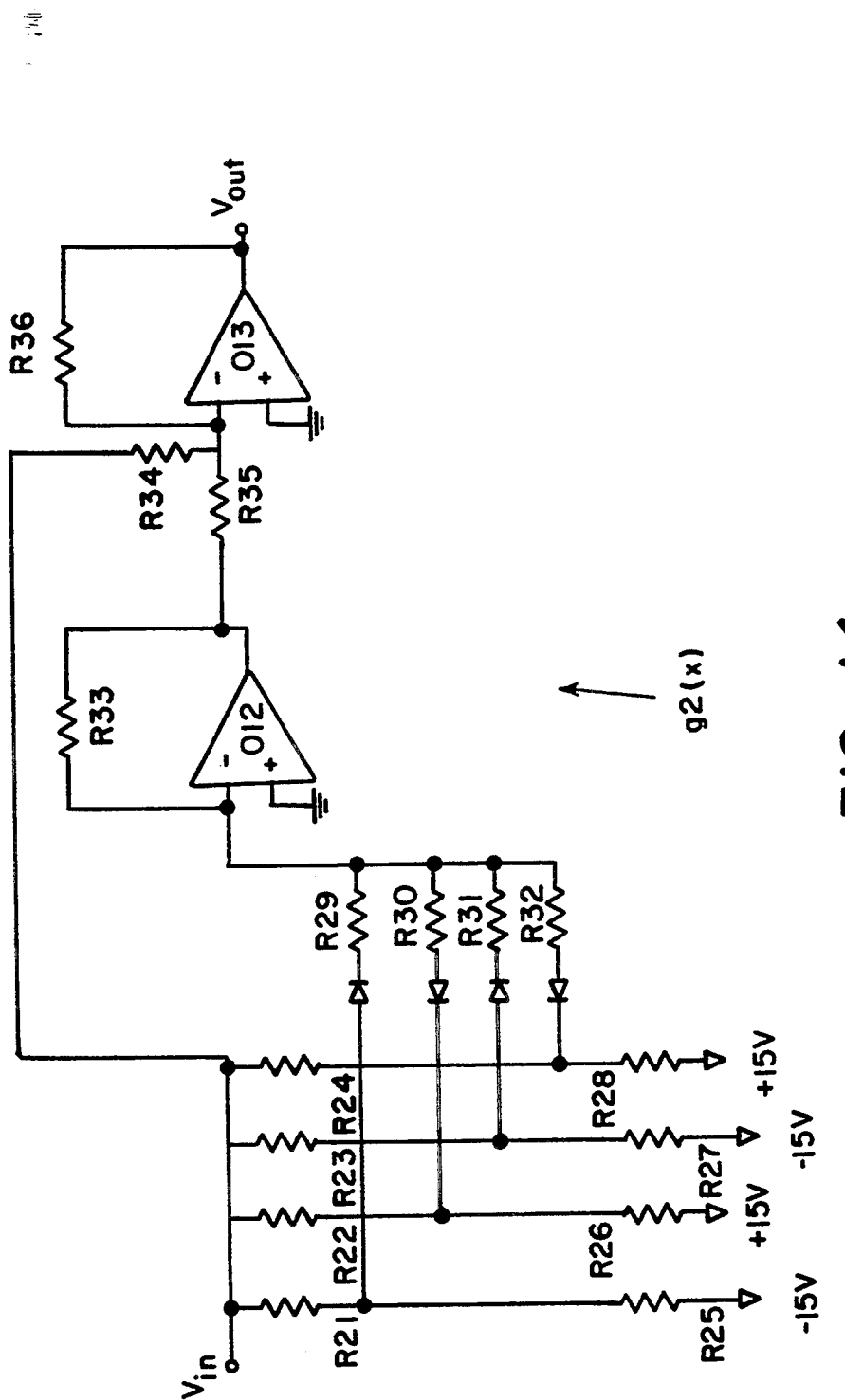

FIG. 14 depicts a circuit with response g2(x) (eqn. 22) where operational amplifiers 012 and 013 are 741 type amplifiers and

| Resistors R21 = 27.4 kΩ | Resistors R29 = 50.1 Ω |
|---|---|
| Resistors R22 = 27.4 kΩ | Resistors R30 = 50.1 Ω |
| Resistors R23 = 49.9 kΩ | Resistors R31 = 50.1 Ω |
| Resistors R24 = 49.9 kΩ | Resistors R32 = 50.1 Ω |
| Resistors R25 = 200 kΩ | Resistors R33 = 20 kΩ |
| Resistors R26 = 200 kΩ | Resistors R34 = 178 kΩ |
| Resistors R27 = 825 kΩ | Resistors R35 = 156.2 kΩ |
| Resistors R28 = 825 kΩ | Resistors R36 = 100 kΩ |

Diodes D5, D6, D7 and D8 are type IN485B.

Figure 15:
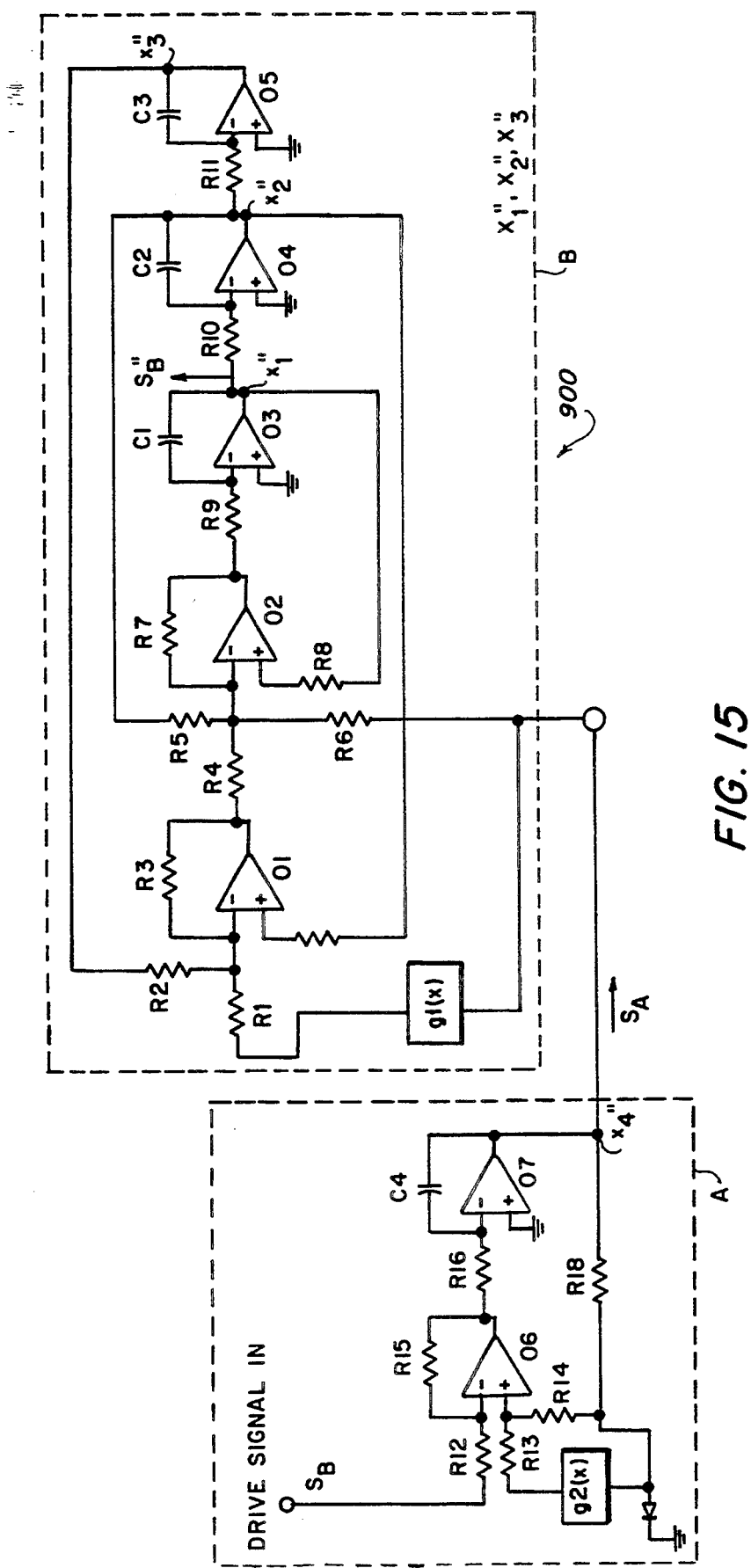

FIG. 15 depicts the circuit details of the receiver 900 of FIG. 11. In this circuit 900 the resistor, capacitor, amplifier and function components are the same as previously discussed regarding FIGS. 12–14.

In FIG. 12 any of the nodes can be used as the source of the signals to be synchronized. However, the drive signal must come from a particular cut point as discussed above.

The above discussion of separated system synchronization is performed with electronic hardware components or other equivalent devices. Using the same concepts, systems can also be synchronized using software. For example, a three dimensional system can be created which uses the Rikitake Two-Disc Dynamo system discussed above (see eqn. 11).

Figure 16:
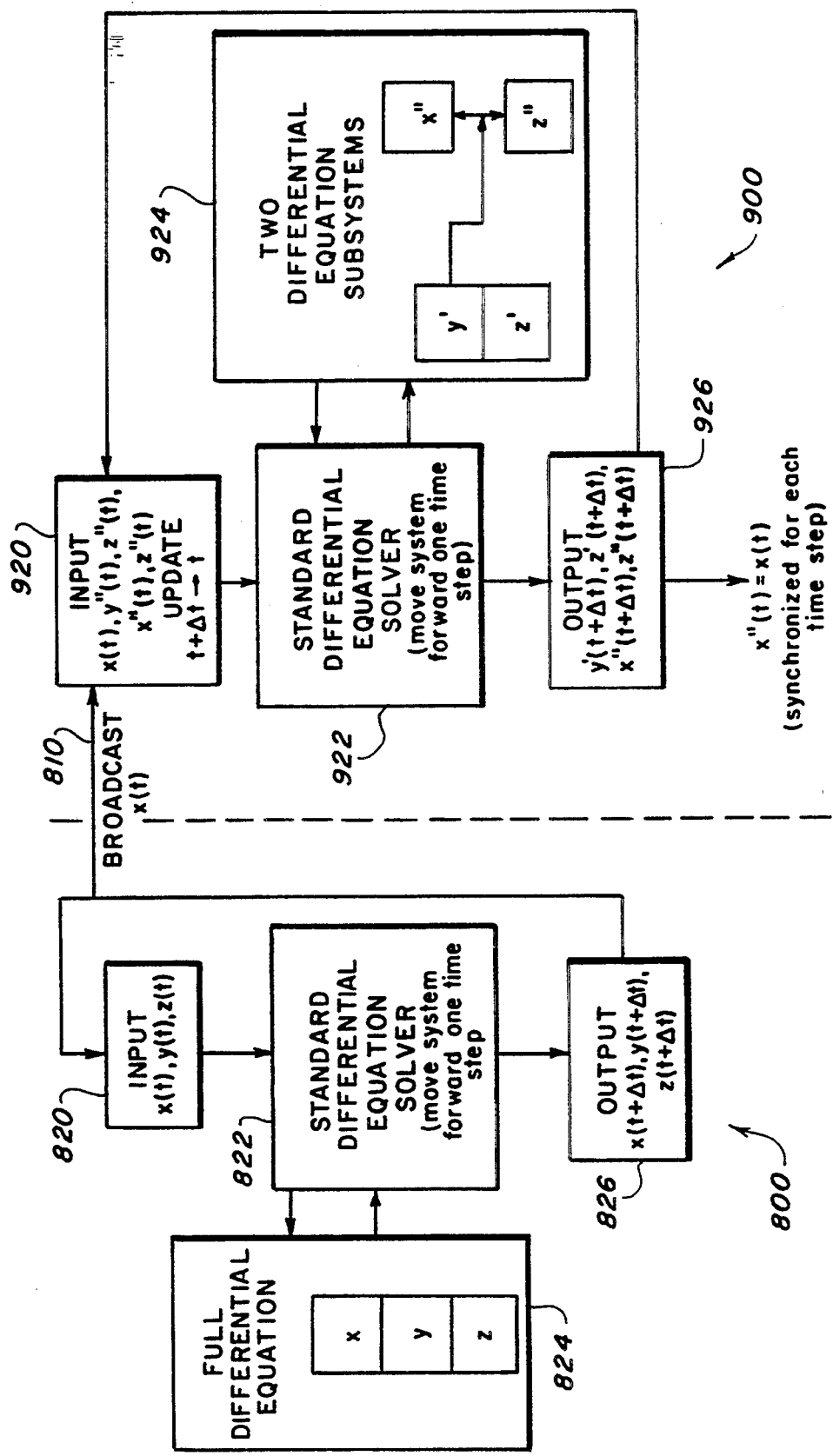
FIGS. 16 and 17 are flow charts of two software versions of the FIG. 11 embodiment.

FIG. 16 is a flow chart illustrating software version of this three dimensional system using the cascade principles previously discussed. The transmitter 800 and receiver 900 are implemented in separate computers, such as a pair of conventional workstations. Each machine performs the operations shown in corresponding loops where each loop is executed once for each time step. In the transmitter 800 the first step of the loop is to input 820 the output values (See block 826) of the prior cycle. These values are passed to a conventional differential equation solver package 822 which has as inputs the differential equations 824, such as equations 21–23, that control the behavior of each element and constitute a differential equation model. The solver produces outputs 826 one of which (x(t)) is broadcast to the receiver 900. The receiver 920 inputs the broadcast signal or value and uses the signals x(t) or values produced in the output (See block 926) of a previous cycle, and it updates the value of t, i.e., t+Δt→t. These values are passed to a conventional differential equations solver package 922 which uses the equations from the two differential equation model subsystems 924 and produces the synchronized drive value as well as other synchronized values as desired.

Figure 17:
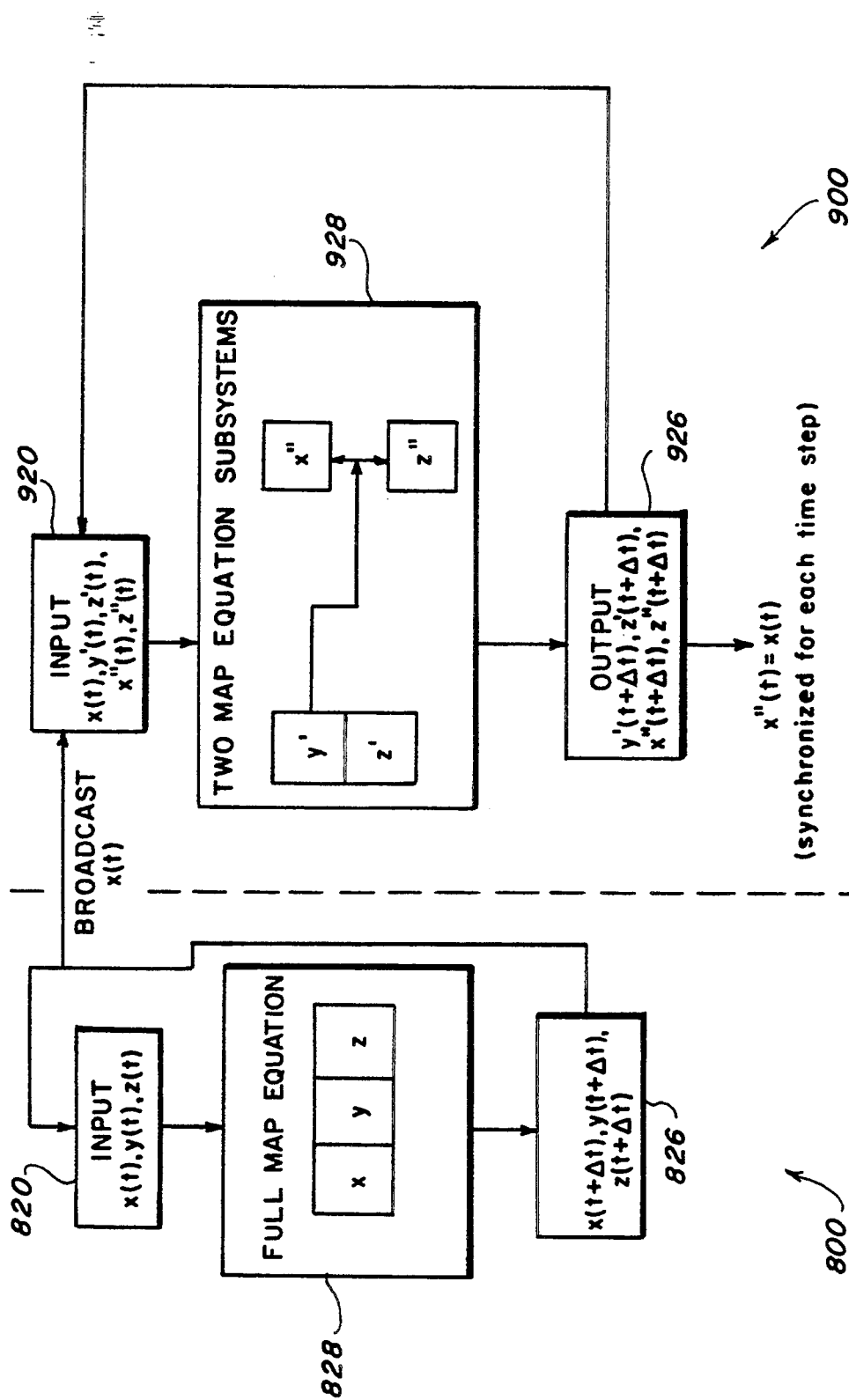

FIG. 17 illustrates another embodiment of the software version shown in FIG. 16 except that the system is three dimensional and uses conventional iterated functions 828 and 928, often called maps, substituted for the differential equations and solver in FIG. 16.

We will now discuss how the system of FIG. 11 can be modified for information transfer or communication. Cascaded synchronization as discussed earlier is quite useful for secure communications. One may consider sending an $S_B$ signal from the full system with an information signal "mixed-in", such as by modulation or by parameter variation.

Figure 18:
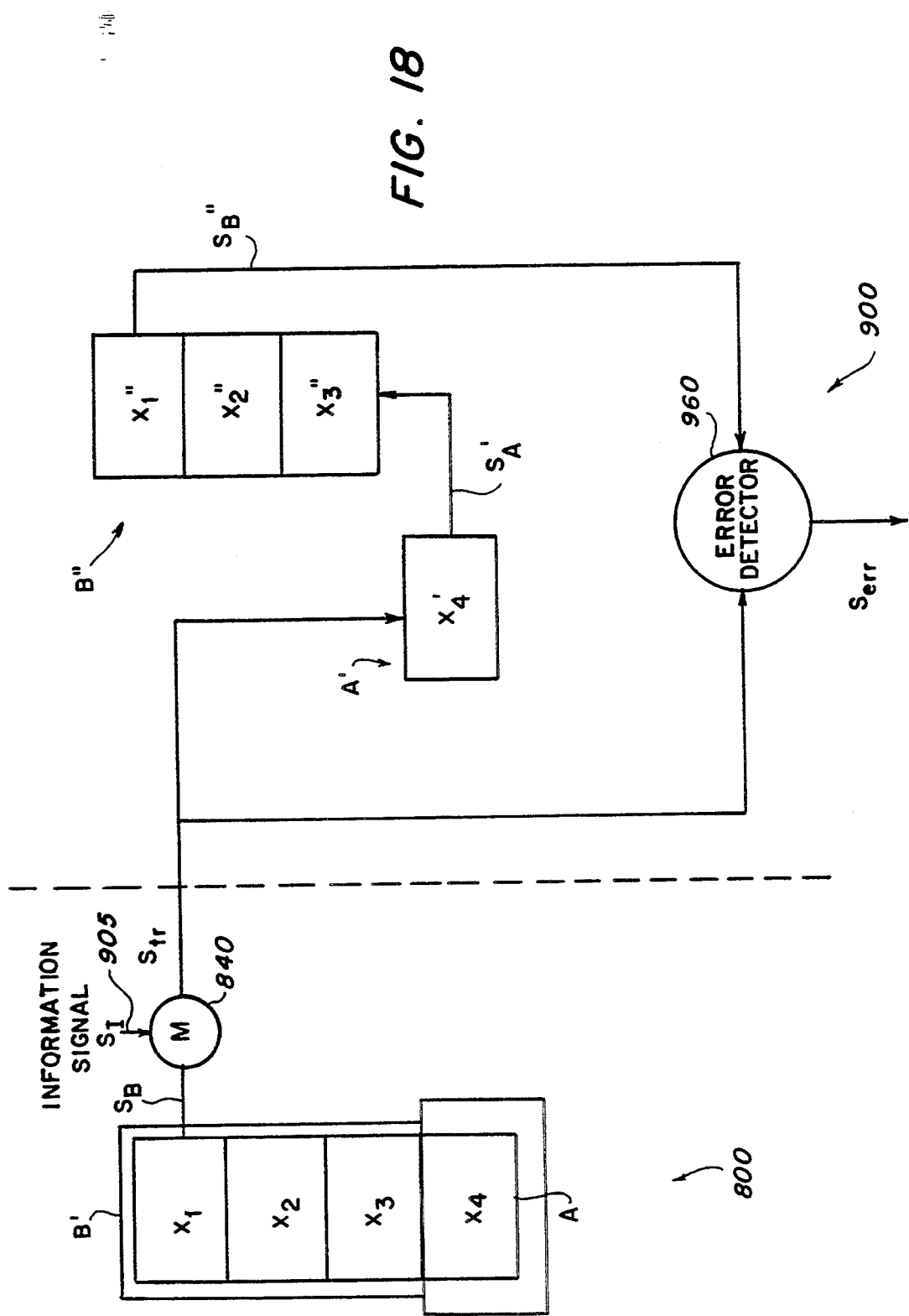
FIG. 18 illustrates a two stage cascaded information transfer system.
Figure 19:
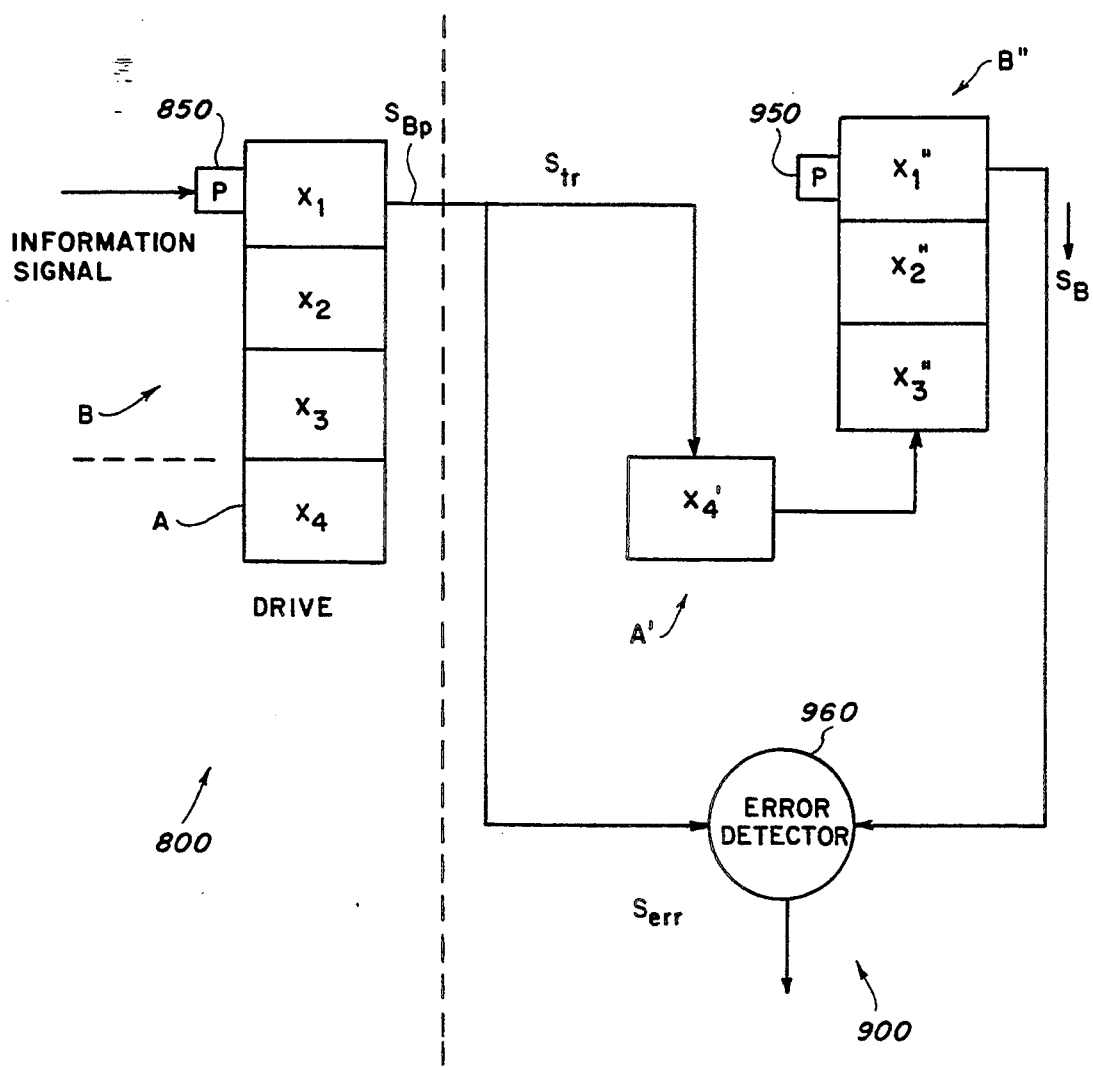
FIG. 19 illustrates a two stage cascaded information transfer system using parameter variation.

Referring now to FIGS. 18 and 19, a drive signal $S_{tr}$ transmitted from the transmitter 800 to the receiver 900 may include information from an information signal $S_I$ or from variation of a parameter 850.

Referring now to FIG. 18, a modulator 840 modulates signal $S_B$ with the information signal $S_I$ to produce a transmitted signal $S_{tr}$. The modulation may be linear (addition) or nonlinear, such as multiplication. The transmitted signal $S_{tr}$ drives the receiver 900. Since the transmitted signal $S_{tr}$ is not the same as a signal $S_B$ which would be produced by the nonlinear system 800, the receiver 900 produces a signal $S_{B''}$ which differs from the transmitted signal $S_{tr}$ and does not synchronize with it over time. An error detection circuit 960 compares response signal $S_{B''}$ with the transmitted signal $S_{tr}$ to produce an error signal $S_{err}$ indicative of the information contained in the information signal $S_I$. If the modulator 840 is nonlinear, it may not be possible for the receiver 900 to recover the signal $S_B$ produced by the transmitter 800 and modulated by the modulator 840.

Figure 20:
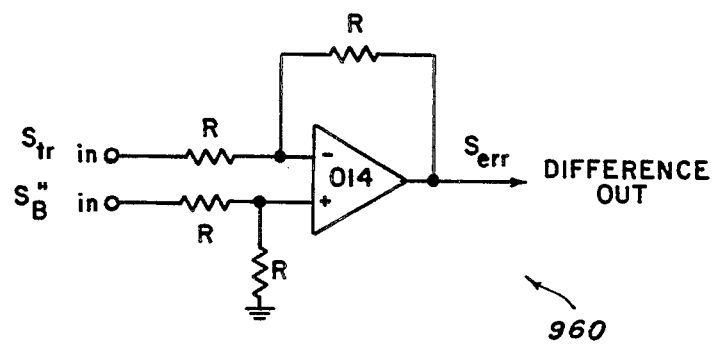
FIG. 20 illustrates the circuit details of the error detector 960 of FIG. 18.

As shown in FIG. 20, the error detector 960 can perform simple subtraction. In that example, the resistors R=10 kΩ and the operational amplifier 014 is a 741 type. The error detector 960 can also strobe the output of the response $S_{B''}$ with the drive signal $S_{tr}$ and average the strobed values to produce a resulting averaged signal proportional in magnitude and sign to the original information signal $S_I$. Other examples of methods for the error detection circuit 960 to compare response signal $S_{B''}$ with the transmitted signal $S_{tr}$ to produce an error signal $S_{err}$ that can be used with the present invention are related to standard phase detection techniques generally used for periodic linear systems.

Referring now to FIG. 19, an information transfer system is shown in which the value of a parameter 850 is varied in the transmitter 800 but the corresponding parameter 950 in the receiver 900 is not varied. Signal $S_B$ denotes the signal that the transmitter 800 would produce if the transmitter 800 used the same parameter 850 as the parameter 950 in the receiver. The transmitter 800 produces a broadcast signal $S_{Bp}=S_{tr}$ which is a chaotic signal modified by the parameter variation. Receiver 900, using subsystems A' and B" (duplicates of subsystems A and B in transmitter 800) produces a chaotic signal $S_{B''}$. An error-detector 960 compares the signal $S_{B''}$ with the broadcast signal $S_{tr}$ and produces an error signal $S_{err}$. In this situation the parameter 850 could be a resistor such as R12 in FIG. 12. In such a situation a variable resistor would be substituted for the fixed resistor shown in FIG. 12. The corresponding parameter 950 in the receiver 900 is fixed, that is, R12 is not a variable resistor in the receiver 900. The output $S_{err}$ produced by the error 960 is called an error signal rather than the information signal because the change in the drive signal $S_{Bp}$ caused by changes in the parameter 850 may be nonlinear. However, if binary information is to be transmitted and the parameter 850 is switched between two values the error signal $S_{err}$ produced by error detector 960 will be a binary waveform that matches the parameter variation, although the magnitude of the signals may not match.

Figure 21A:
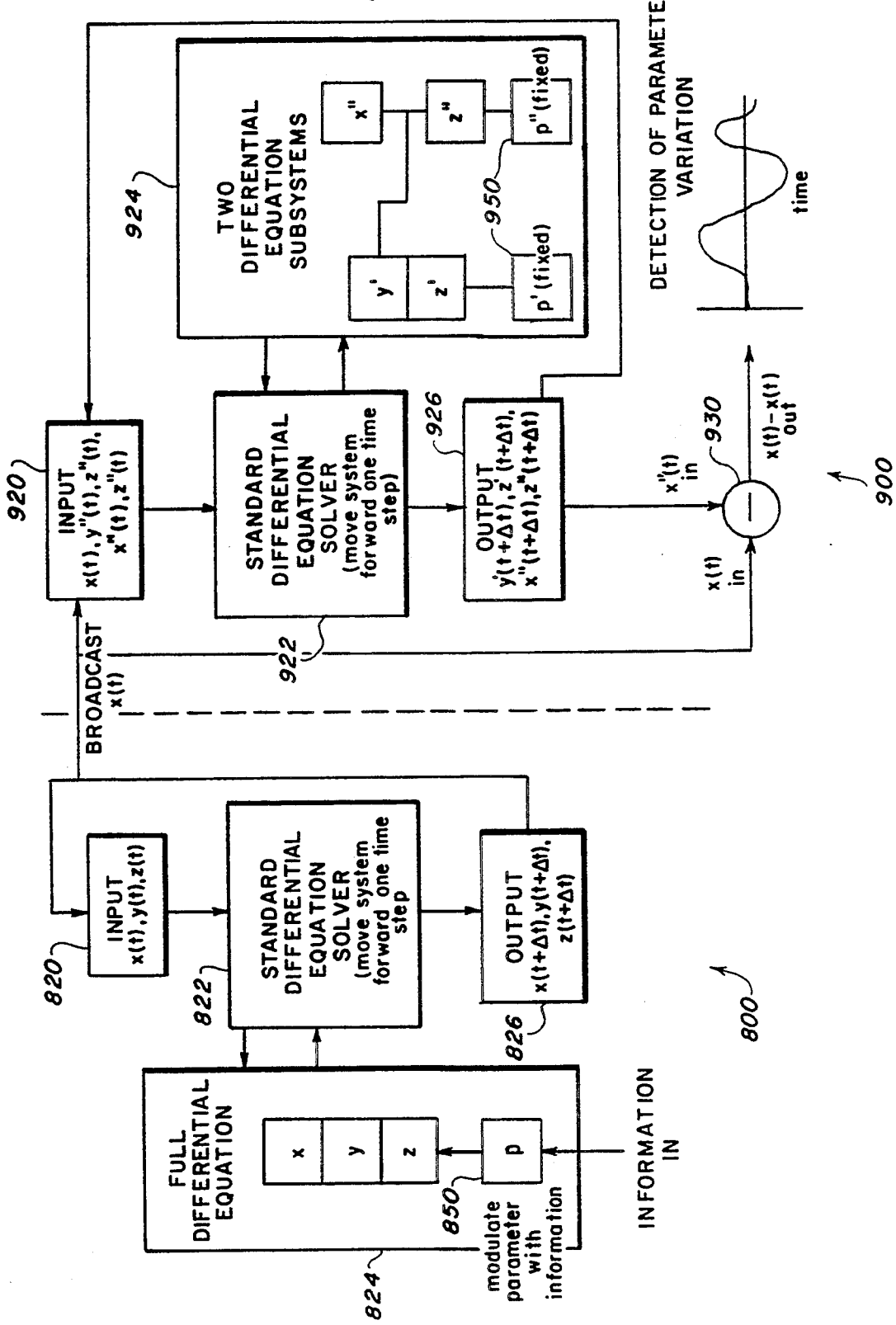
FIGS. 21A and B are flowcharts of a software version of FIG. 20.

FIG. 21A illustrates an embodiment like FIG. 20 implemented in software using differential equations and a differential equations solver for which iterated functions (maps) could be substituted, as shown in FIG. 21B, if desired. In the differential equations in the transmitter 800 the parameter 850 is modified responsive to the information signal. For example, in equation 13 the constant $A_1$ of the x1 term is converted into a variable that changes responsive to the input signal. In the receiver 900 the corresponding parameter 950 is fixed. The receiver 900 includes a comparison operation 930 that corresponds to the error detector 960 of FIGS. 18-20.

Figure 22:
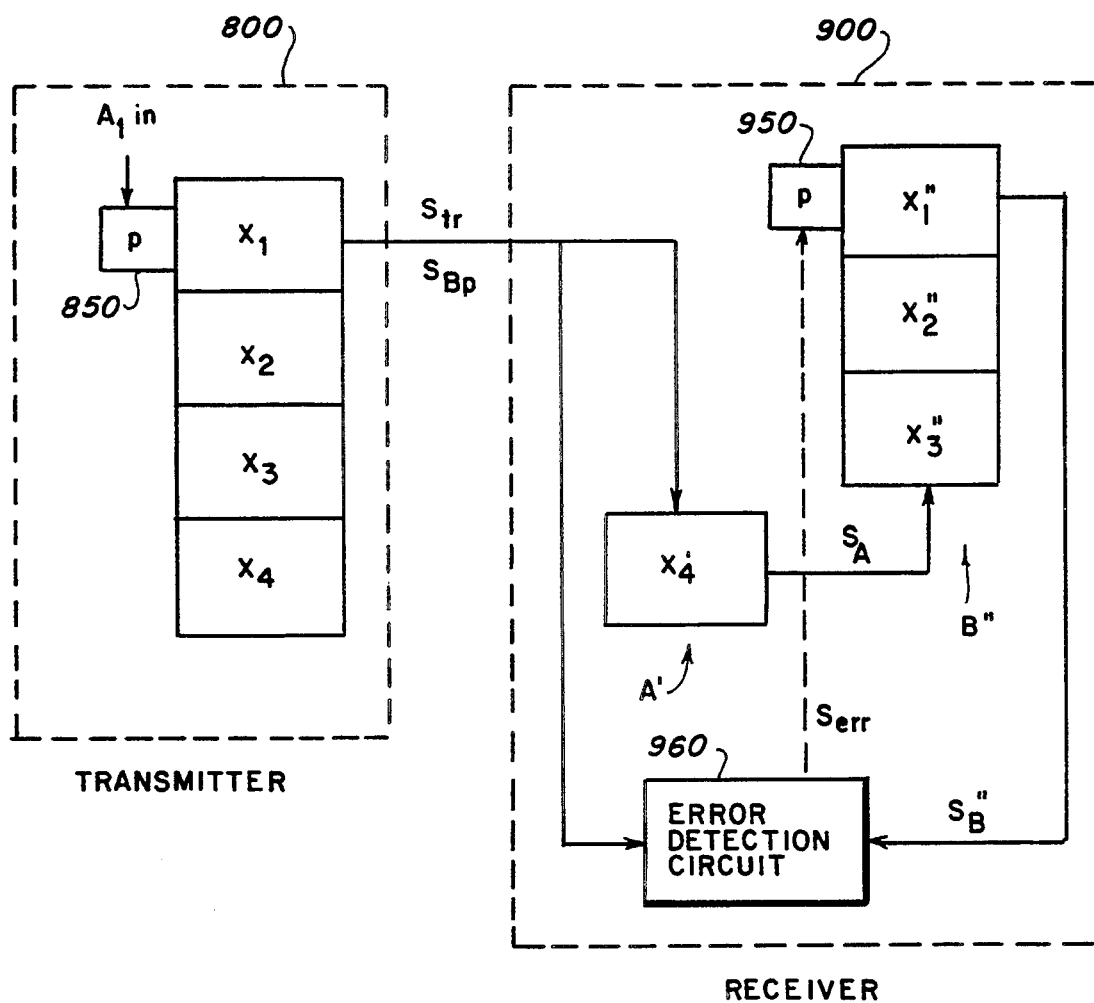
FIG. 22 illustrates a second parameter variation system.
Figure 23:
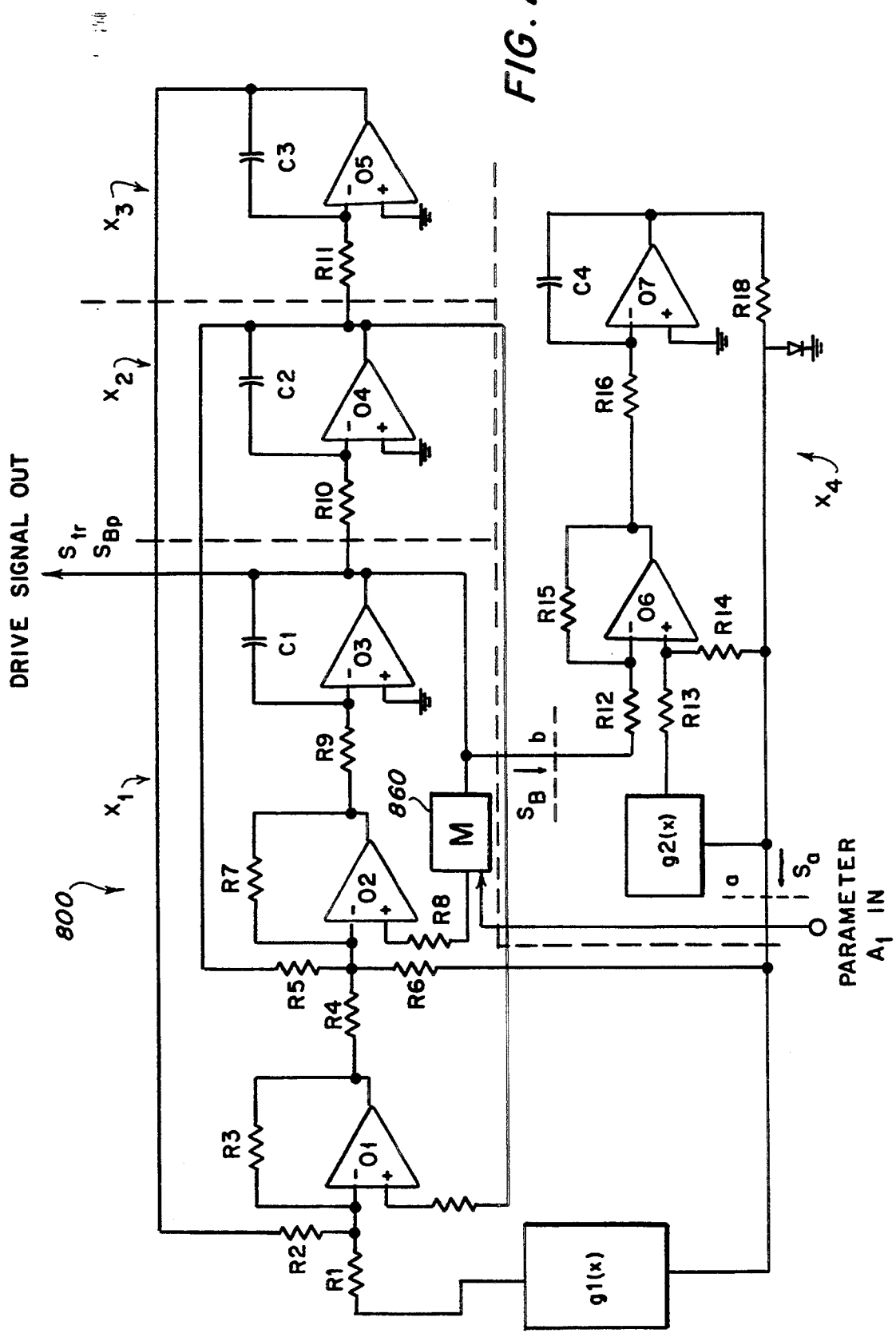
FIGS. 23–26 depict the circuit details of the FIG. 22 embodiment.
Figure 24:
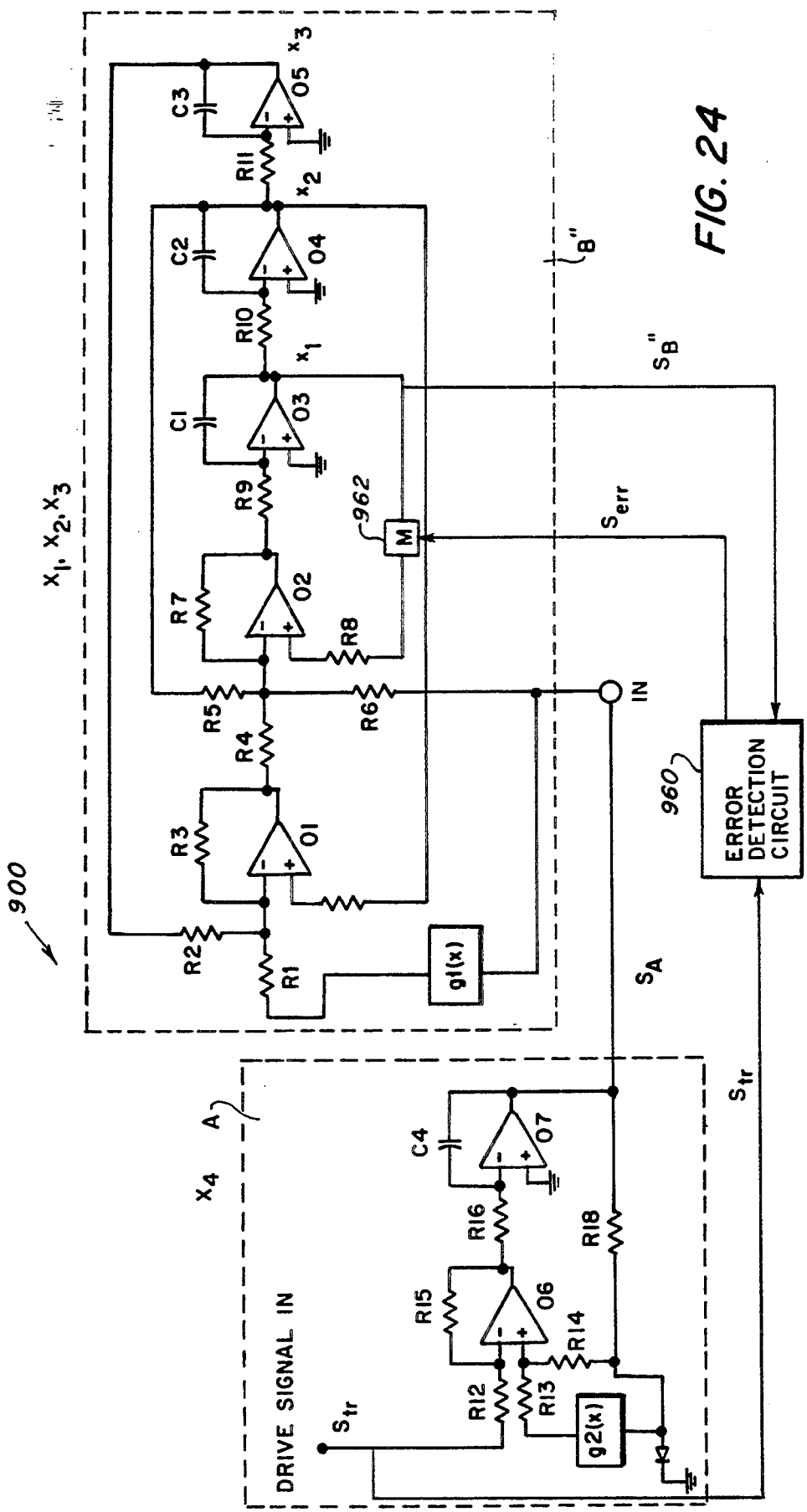

FIG. 22 illustrates a further version of the parameter variation embodiment. In this example, as the parameter 850 is varied in the transmitter 800 an error detection circuit 960 in the receiver 900 produces an error signal that changes the corresponding parameter 950 in the receiver 900. That is, in this embodiment the parameters 850 and 950 are both variable. During operation the receiver 900 produces the $S_{B'}$ drive signal based on the previous value of the parameter which differs from the current $S_{tr}$ drive signal. The difference or error indicates the direction (and how much) the parameter in the receiver needs to be modified to bring the signals into exact synchronization. The parameter is modified by the output $S_{err}$ of the error detection circuit 960. Referring now to FIGS. 23 and 24, when implementing this version in the circuit of FIGS. 12-15, modulators 860 and 962 are added to the transmitter 800 and receiver 900, respectively, both modulators 860 and 962 being, for example, analog multipliers type AD632.

Figure 25:
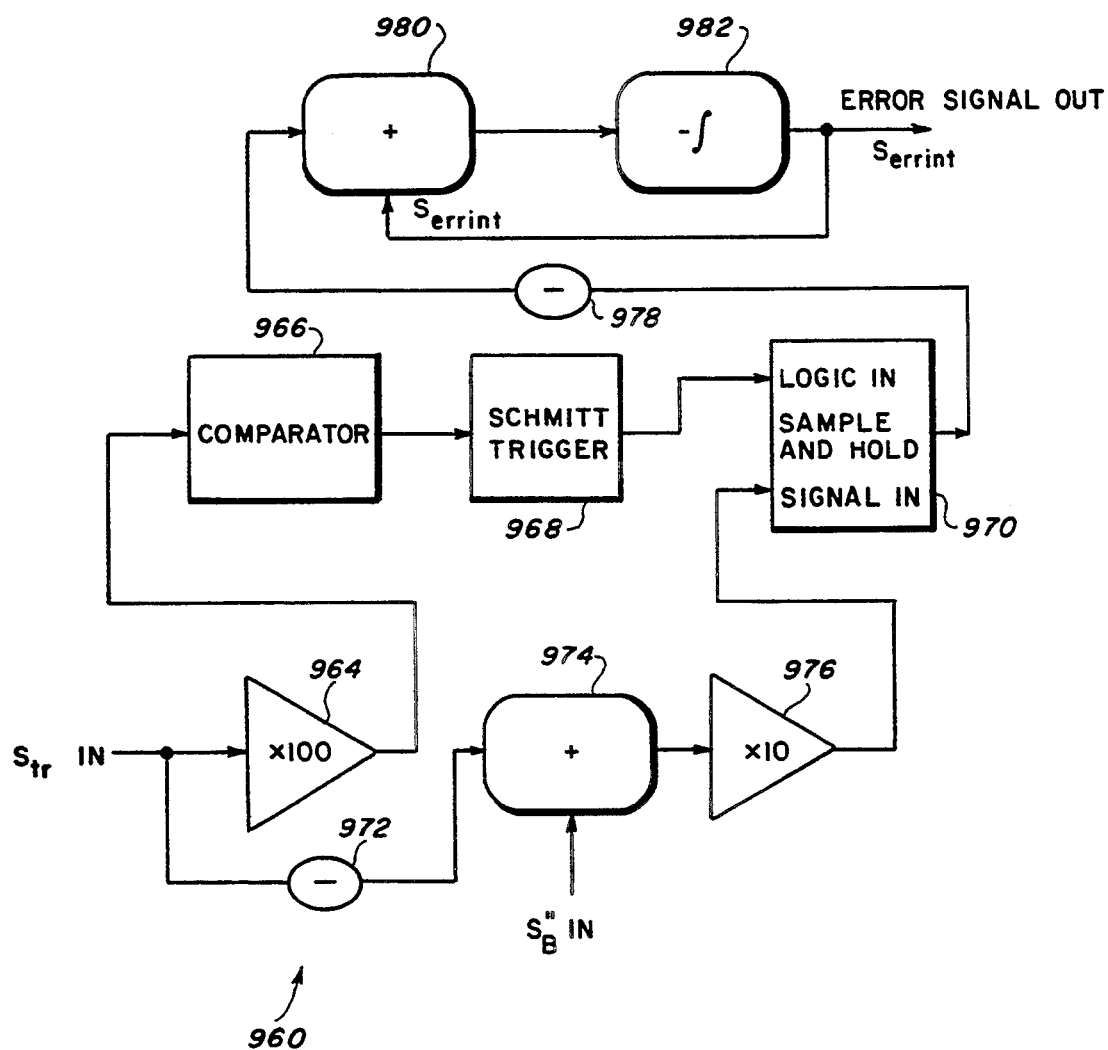
Figure 26:
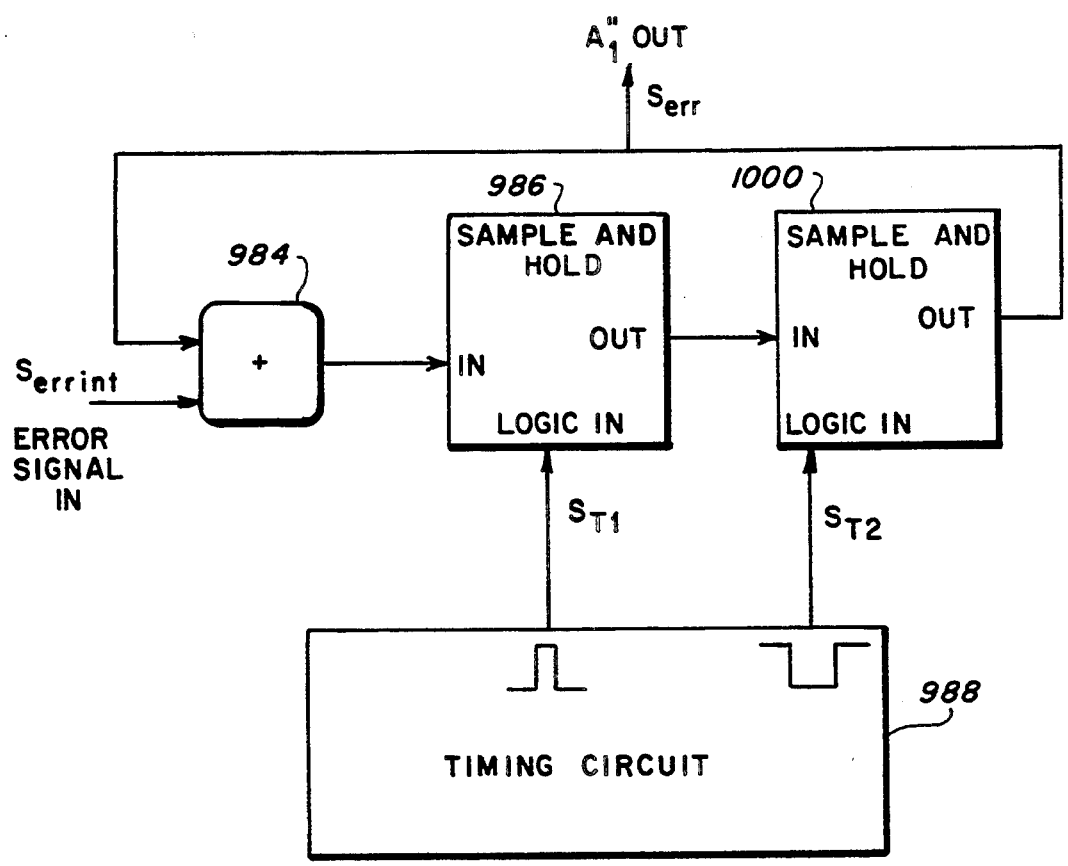

FIGS. 25 and 26 illustrate the details of an error detection circuit 960 which performs a conventional averaging phase detection operation. The information-containing drive signal $S_{tr}$ generated by the transmitter 800 is applied to an amplifier 964 with a high gain (FIG. 25), such as a 741 type amplifier. The output of the amplifier 964 is applied to a conventional comparator 966, such as a AD 790. The comparator 966 produces an output when the input signal is greater than zero. The positive going signal triggers a conventional Schmitt trigger circuit 968, such as SN 74121. The input signal $S_{tr}$ from the transmitter 800 is also applied to a conventional invertor 972 the output of which is applied to a conventional adder 974, such as a 741 type amplifier. The adder 974 also receives the signal internally generated in the receiver 900. The output of adder 974 is amplified by a conventional amplifier 976, such as a 741 type, and applied to the signal input of a conventional sample and hold circuit 970, such as an LF 398, and the output of the Schmidt trigger circuit 968 is applied to the logic input of the sample and hold circuit 970. The sampled signal produced by the sample and hold circuit 970 is applied to a conventional invertor 978, such as a 741 type amplifier and the signal is then applied to a conventional adder 980, such as 741 type amplifier. The adder 980 accumulates the sampled signal and an intermediate error signal $S_{errint}$. The intermediate error signal $S_{errint}$ is produced by a conventional integrator 982, such as type 741 amplifier with a mica capacitor used for feedback, that averages the output of the adder 980. As illustrated in FIG. 26 the intermediate error signal $S_{errint}$ is applied to another conventional adder 984, such as a type 741 amplifier. The adder 984 also receives a feedback signal $S_{err}$ and applies its output to a first conventional sample and hold circuit 986, such as an LF 398, which samples the signal responsive to a first timing signal $S_{T1}$ from a timing circuit 988. The timing circuit also produces a second timing signal $S_{T2}$ completely out of phase with the first timing signal and which causes a second sample and hold circuit 1000 to hold the output of the first circuit 986. The output $S_{err}$ of the sample and hold circuit 1000 drives the analog modulator 962 of the second stage B" of the cascaded receiver 900 (FIG. 24). The error detection circuit 960 causes the receiver system to operate somewhat like a phase locked loop with the error signal tracking the information signal. Any circuit 960 which averages the phase difference between signal $S_{tr}$ and $S_{B'}$ could be readily substituted for the error detection circuit 960 shown in FIGS. 25 and 26.

FIG. 27A depicts an embodiment similar to that of FIG. 22 that is implemented in software using differential equations and a differential equations solver for which iterated functions (maps) could be substituted, as shown in FIG. 27B, if desired. In this case the system replaces the subtraction operation 930 of FIG. 21 with a comparison operation 932 and a parameter determination operation 934 which together determines how much to vary the parameter and thus track the original information signal. These circuits perform the operation of equation (8) when equation (8) is inverted. Of course the conventional differential equation solver and the differential equations of this embodiment can have an iterated function substituted for them.

The foregoing descriptions of the preferred embodiments are intended to be illustrative and not limiting. It will be appreciated that numerous modifications and variations can be made without departing from the spirit or scope of the present invention.

What is claimed is:

1. A cascaded synchronized nonlinear electrical system comprising:
   (a) a nonlinear transmitter having stable first and second subparts, said first subpart producing a first transmitter signal for driving said second subpart, said second subpart producing a second transmitter signal for driving said first subpart, said nonlinear transmitter being for transmission of said second transmitter signal; and
   (b) a nonlinear cascaded receiver responsive to said second transmitter signal transmitted by said transmitter, said receiver being for producing an output signal in synchronization with said second transmitter signal, said receiver comprising a first stage responsive to said second transmitter signal for producing a first receiver signal, said first stage being a duplicate of said first subpart, and said receiver further comprising a second stage responsive to said first receiver signal for producing said output signal, said second stage being a duplicate of said second subpart.

2. The system of claim 1 wherein said first stage produces said first receiver signal in synchronization with said first transmitter signal.

3. The system of claim 1 wherein said transmitter comprises a non-Lorenz system.

4. The system of claim 3 wherein said transmitter comprises a non-Chua circuit.

5. The system of claim 1 wherein said transmitter comprises a non-Chua circuit.

6. The system of claim 1, wherein at least part of said first subpart of element (a) is external to said second subpart of element (a), and at least part of said second subpart of element (a) is external to said first subpart of element (a).

7. An electrical information transfer system comprising:
(a) a nonlinear transmitter responsive to an information signal for producing a drive signal, said transmitter having stable first and second subparts, said first subpart producing a first transmitter signal for driving said second subpart, said second subpart producing a second transmitter signal for driving said first subpart, said nonlinear transmitter being responsive to said second transmitter signal for transmission of said drive signal; and
(b) a nonlinear cascaded receiver responsive to said drive signal, said receiver comprising a first stage responsive to said drive signal for producing a first receiver signal, said first stage being a duplicate of said first subpart, and said receiver further comprising a second stage responsive to said first receiver signal for producing an output signal, said second stage being a duplicate of said second subpart; and
(c) an error detector coupled to said receiver being responsive to said drive signal and to said output signal for producing an error signal indicative of the information contained in said information signal.

8. The system of claim 7 wherein said transmitter comprises a non-Lorenz system.

9. The system of claim 8 wherein said transmitter comprises a non-Chua circuit.

10. The system of claim 7 wherein said transmitter comprises a non-Chua circuit.

11. The system of claim 7 wherein said transmitter comprises a modulator responsive to said second transmitter signal and to said information signal for producing said drive signal.

12. The system of claim 11 wherein said modulator is a nonlinear modulator.

13. The system of claim 7 wherein said transmitter further comprises means responsive to said information signal for varying the value of a transmitter parameter.

14. The system of claim 13 further comprising means responsive to said error signal for varying the value of a receiver parameter corresponding to said transmitter parameter so that the variation of said receiver parameter is in synchronization with the variation of said transmitter parameter.

15. A synchronized electrical system, comprising:
a nonlinear dynamic drive system for producing a drive signal and transmitting the drive signal, the drive system having at least two stable subsystems; and
a cascaded nonlinear driven system responsive to said drive system to receive the drive signal and comprising cascade connected subsystems of the driven system, said driven system subsystems being substantially duplicates of said at least two drive system subsystems, said at least two driven subsystems comprising a first subsystem responsive to the drive signal and a second subsystem for producing an output signal in synchronization with the drive signal.

16. A system as recited in claim 15, wherein said drive system produces a first signal to be synchronized and said driven system reproduces the first signal.

17. The system of claim 15, wherein said driven system comprises a non-Lorenz device.

18. A synchronized electrical system, comprising:
a nonlinear dynamic drive system for producing a dynamic drive signal and having at least a first and a second interdependent and stable subsystem for producing a first signal to be synchronized; and
a nonlinear dynamic driven system coupled to said drive system and receiving the drive signal, said driven system comprising:
a first driven subsystem comprising a duplicate of said first subsystem of said drive system, said first driven subsystem being interdependent to synchronize and reproduce the first signal; and
a second subsystem comprising a duplicate of said second subsystem of said drive system, said second driven subsystem being connected to the first driven subsystem and being responsive thereto to receive the reproduced signal and being interdependent to synchronize and reproduce the drive signal.

19. The system of claim 18, further comprising a comparator for comparing the drive signal and the reproduced drive signal to confirm synchronization.

20. A method of synchronizing, comprising the steps of:
(a) electrically producing a drive value and a first value to be matched using a differential equation model:
(b) broadcasting the drive value to a receiver; and
(c) electrically producing in the receiver an output value and a receiver first value in synchronization with the drive value and the first value, respectively, by using the drive value received and at least a pair of stable differential equation model subsystems which are subsets of the equation model, wherein said pair of differential equation model subsystems includes at least one common variable, said pair of differential equation model subsystems comprising a first subsystem dependent on the drive value for producing the receiver first value and a second subsystem dependent on the receiver first value for producing the output value.

21. A method as recited in claim 20, further comprising comparing the drive value and the reproduced drive value to confirm matching of the first value and the reproduced first value.

22. An electrical information transfer system, comprising:
a transmitter having at least two stable subsystems for producing a dynamic drive signal carrying an information signal; and
a cascaded receiver coupled to said transmitter to receive the drive signal and comprising:
cascade connected subsystems of the receiver, said receiver subsystems being substantially duplicates of said at least two transmitter subsystems for producing a reproduced signal comprising the drive signal with the information signal removed; and
a combining circuit for combining the dynamic drive signal and the reproduced signal to reproduce the information signal.

23. The system of claim 22, wherein said combining circuit comprises a nonlinear device.

24. A system as recited in claim 22, wherein said transmitter comprises a drive system producing a drive signal and an adder combining the drive signal and the information signal to produce the dynamic drive signal carrying the information signal.

25. A system as recited in claim 22, wherein said combining circuit is an error detector.

26. The system of claim 22, wherein said transmitter comprises a drive system for producing a drive signal and a nonlinear combining circuit for combining the drive signal and the information signal to produce the dynamic drive signal.

27. A method of transferring information, comprising the steps of:
(a) electrically producing drive value using a differential equation model;
(b) combining the drive value with an information value to produce a broadcast value;
(c) broadcasting the broadcast value to a receiver;
(d) electrically reproducing the drive value in the receiver from the broadcast value and at least a pair of stable differential equation model subsystems which includes subsets of the equation model, wherein said pair of differential equation model subsystems includes at least one common variable; and
(e) combining the reproduced drive value with the broadcast value to reproduce the information value.

28. A method as recited in claim 27, wherein step (b) comprises adding the drive value and the information value and step (e) comprises subtracting the reproduced drive value from the broadcast value.

29. An electrical information transfer system, comprising:
a transmitter including a parameter and having at least two stable subsystems, said transmitter being for producing a dynamic drive signal carrying an information signal produced by parameter variations; and
a cascaded receiver coupled to said transmitter to receive the drive signal and comprising:
cascade connected subsystems of the receiver, said receiver subsystems being substantially duplicates of said at least two transmitter subsystems for producing a reproduced signal comprising the drive signal with the information signal removed; and
a combining circuit combining the drive signal and the reproduced signal to produce a parameter difference signal indicating variations in the parameter.

30. A system as recited in claim 29, wherein the receiver includes a fixed parameter.

31. A system as recited in claim 30, wherein said combining circuit comprises an error detector.

32. A method of information transfer, comprising the steps of:
(a) electrically producing a drive value using a differential equation model with a varied equation parameter varied responsive to an information value;
(b) broadcasting the drive value to a receiver;
(c) electrically reproducing the drive value in the receiver from the broadcast drive value and at least a pair of stable differential equation model subsystems which are subsets of the equation model, wherein said pair of differential equation model subsystems includes at least one common variable with the parameter fixed; and
(d) combining the reproduced drive value with the broadcast drive value to produce a parameter change value corresponding to the information value.

33. A method as recited in claim 32, wherein step (a) comprises changing the parameter between two values and the parameter change value changes between a pair of values.

34. An electrical information transfer system, comprising:
a transmitter including a parameter having at least two stable subsystems for producing a dynamic drive signal carrying an information signal produced by parameter variation; and
a cascaded receiver coupled to said transmitter to receive the drive signal and comprising:
cascade connected subsystems of the receiver, including the parameter said receiver subsystems being substantially duplicates of said at least two transmitter subsystems and being for producing a reproduced signal comprising the drive signal with the information signal removed;
a combining circuit combining the drive signal and the reproduced signal to produce a parameter error signal; and
a parameter change circuit changing the parameter of the receiver to match the parameter variation of said transmitter to reproduce the information signal responsive to the parameter error signal.

35. A system as recited in claim 34, wherein said combining circuit comprises an error detection circuit and said parameter change circuit performs stepwise matching of the parameter variation.

36. A method of transferring information, comprising the steps of:
(a) electrically producing a drive value using a source differential equation model with a varied equation parameter varied responsive to an information value;
(b) broadcasting the drive value to a receiver;
(c) electrically reproducing the drive value in the receiver from the broadcast value and at least a pair of stable differential equation model subsystems which are subsets of the equation model, wherein said pair of differential equation model subsystems includes at least one common variable and which includes the parameter;
(d) combining the reproduced drive value with the broadcast value to produce a parameter error; and
(e) changing the parameter of the differential equation subsystems responsive to the parameter error.

* * * * *